United States Patent
Hashimoto et al.

(10) Patent No.: US 6,905,934 B2
(45) Date of Patent: Jun. 14, 2005

(54) SEMICONDUCTOR DEVICE AND A METHOD OF MANUFACTURING THE SAME

(75) Inventors: Takashi Hashimoto, Akishima (JP); Kouji Mikami, Hamura (JP); Tsutomu Udo, Musashimurayama (JP); Masao Kondo, Higashimurayama (JP); Eiji Oue, Ome (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 32 days.

(21) Appl. No.: 10/086,689

(22) Filed: Mar. 4, 2002

(65) Prior Publication Data

US 2002/0142557 A1 Oct. 3, 2002

(30) Foreign Application Priority Data

Mar. 28, 2001 (JP) .......................... 2001-092551

(51) Int. Cl.⁷ ............................................ H01L 21/331
(52) U.S. Cl. ........................................ 438/309; 257/592
(58) Field of Search ................................... 438/309, 350, 438/364–366, 370; 257/510, 539, 536–537, 592

(56) References Cited

U.S. PATENT DOCUMENTS 4,892,837 A * 1/1990 Kudo .......................... 438/365
5,204,276 A * 4/1993 Nakajima et al. ........... 438/366

FOREIGN PATENT DOCUMENTS

JP           6-112215           4/1994

* cited by examiner

*Primary Examiner*—David Nelms
*Assistant Examiner*—David Vu
(74) *Attorney, Agent, or Firm*—Mattingly, Stanger, Malur & Brundidge, P.C.

(57) ABSTRACT

The invention provides a bipolar transistor with improved performance. An insulation film comprising a silicon oxide film is formed by means of oxidation treatment on the side surface of an emitter aperture, and then an epitaxial layer comprised of SiGe is grown selectively in an aperture formed by removing a silicon nitride film so as to form under cut.

24 Claims, 31 Drawing Sheets

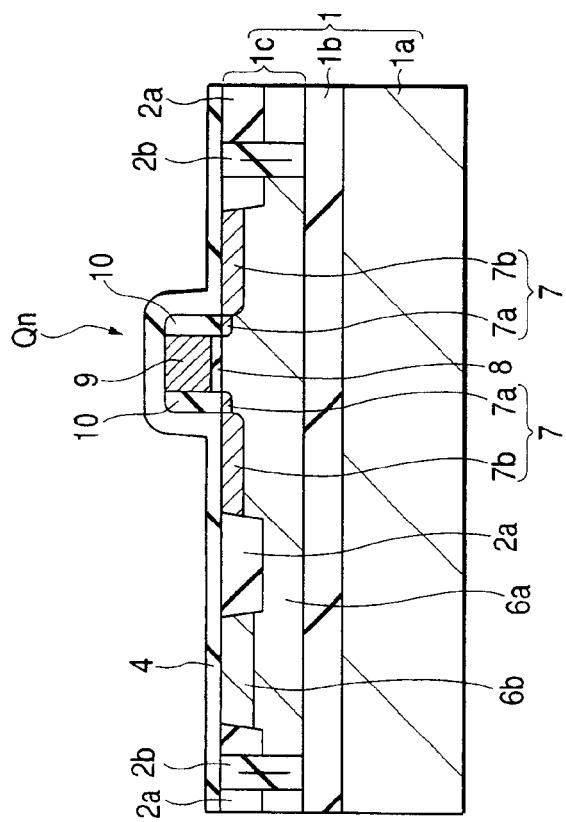
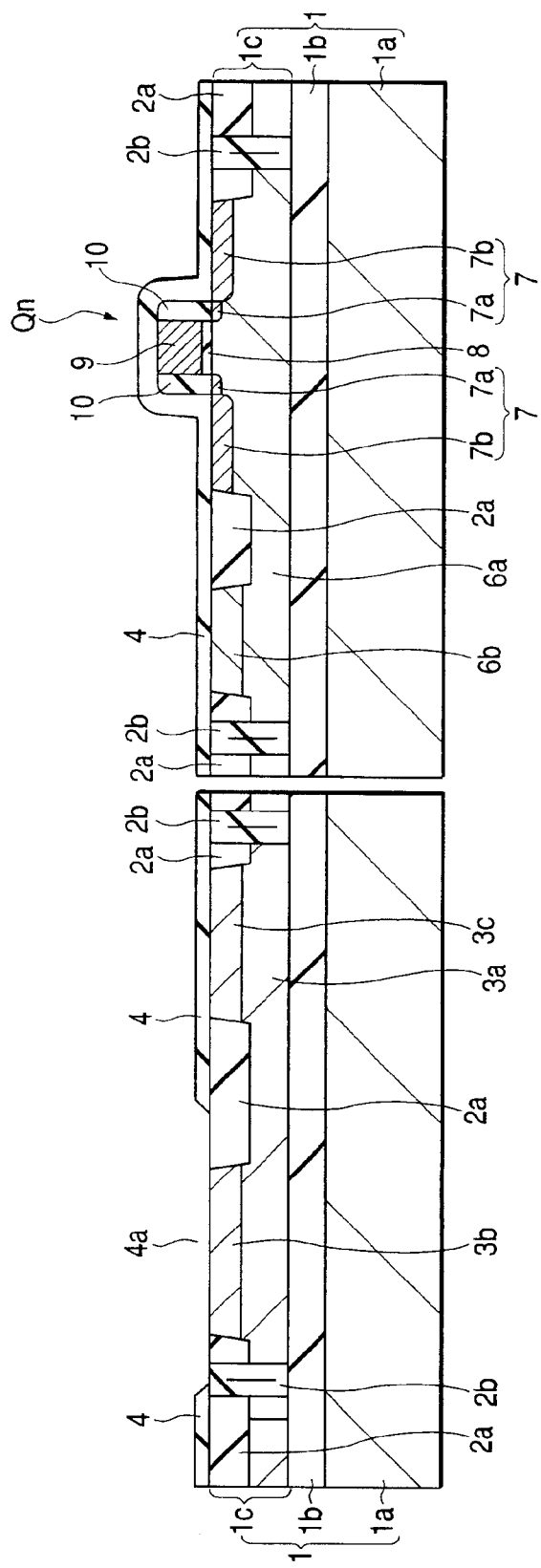

SEMICONDUCTOR DEVICE AND A METHOD OF MANUFACTURING THE SAME

BACKGROUND OF THE INVENTION

This invention relates to a method for manufacturing a semiconductor device and a semiconductor device technique, and more particularly relates to a technique that is effectively applied to a technique for manufacturing a semiconductor device having a bipolar transistor with so-called self-alignment type or HBT (Hetero-junction Bipolar Transistor) structure, which have a base layer formed by use of selective epitaxial growing technique.

The self-alignment type bipolar transistor technique, in which a base layer of a bipolar transistor is formed by use of selective epitaxial growing technique, has been developed to improve the high speed performance of a bipolar transistor. For example, Japanese Unexamined Patent Publication No. Hei 6(1994)-112215 discloses a self-alignment type bipolar transistor technique. One example of a method for forming a self-alignment type bipolar transistor will be described herein under.

At first a shallow groove is formed on a semiconductor substrate for element separation. Thereafter, a silicon oxide film, a p-type polycrystalline silicon film, and a silicon nitride film are deposited on the semiconductor substrate by mean of CVC (Chemical Vapor Deposition) technique in the order from the bottom. Subsequently, the silicon nitride film and the p-type polycrystalline silicon film are dry etched to form an emitter aperture. Thereafter a silicon nitride film is formed by means of CVD technique, and then the silicon nitride film is subjected to etch back to form a side wall comprising the silicon nitride film on the side wall of the emitter aperture. At that time, CHF base gas is used as the etching gas because of the selectivity of the silicon oxide film. Next, the silicon oxide film on the bottom of the emitter aperture is subjected to wet etching by use of the silicon nitride film and the side wall as a mask. At that time, the silicon oxide film located just under the side wall and under the p-type polycrystalline silicon film is etched to form an under cut portion. Next, for example, a p-type epitaxial SiGe layer is formed on the portion in the emitter aperture where the semiconductor substrate surface and the polycrystalline silicon film are exposed by means of selective epitaxial growing technique. At that time, the under cut portion located just under the polycrystalline silicon film is embedded in the SiGe layer, and the p-type polycrystalline silicon film is connected to the SiGe layer. Furthermore, an $n^+$-type polycrystalline silicon film is formed to form an emitter polycrystalline silicon electrode. Thereafter, impurity is thermally diffused from the $n^+$-type polycrystalline silicon layer to form an $n^+$-type emitter region on the SiGe layer.

SUMMARY OF THE INVENTION

The inventors of the present invention have found that the above-mentioned self-alignment type bipolar transistor forming technique is involved in a problem as described herein under.

In detail, the conventional technique is disadvantageous in that a bipolar transistor with reduced leak current is formed. Usually, CHF base etching gas that has been converted to plasma with a high frequency (RF) power, for example, 1000 W for etching when a silicon nitride film is to be etched is used for etching. As the result, hydrogen ions, which are light element and have high kinetic energy, penetrate through the silicon oxide film under layer to cause damage on the element forming portion of the semiconductor substrate even though the etching of the silicon nitride film can be stopped at the surface of the silicon oxide film that is located under the silicon nitride film. The penetration of hydrogen ions results in poor crystallinity of the epitaxial layer to be served for forming a base that will be grown thereafter, and the poor crystallinity of the epitaxial layer results in poor performance of a bipolar transistor.

The above-mentioned technique for forming a self-alignment type bipolar transistor is disadvantageous in that the emitter resistance increases sharply as the emitter width becomes narrow. The coverage of an $n^+$-type polycrystalline silicon film for forming an emitter electrode deposited by means of CVD technique is lower than that of a non-doped type polycrystalline silicon film, and the coverage of the former film is only approximately 0.7 to 0.8. As the result, the narrow emitter width and large aspect of the emitter aperture causes voids in the polycrystalline silicon film in the emitter aperture when an $n^+$-type polycrystalline silicon film is embedded in the emitter aperture as described hereinabove, and the emitter resistance is increased the more.

The object of the present invention is to provide a technique that is capable of improving the bipolar transistor performance.

The above-mentioned object and other objects, and the new advantages will be apparent in the description of the specification with reference to the attached drawings.

The outline of the typical invention out of the inventions disclosed in the specification of the present invention is described herein under briefly.

The present invention provides a method comprising a step in which, prior to selective growth of a base region forming epitaxial layer on a semiconductor substrate that is exposed from the bottom of an emitter aperture, an insulation film that functions as a protection film during the epitaxial growing in the emitter aperture is formed.

The outline of another invention out of the inventions disclosed in the specification of the present invention is described herein under briefly.

The present invention provides a method comprising a step in which, after the side surface of an insulation film interposed between an emitter electrode and a base electrode of a bipolar transistor formed on a semiconductor substrate is recessed from the side surface of the emitter electrode, a metal film is deposited on the semiconductor substrate followed by heat treatment to form a silicide layer on the portion where the emitter electrode, base electrode, semiconductor substrate, and metal film are in contact with each other.

BRIEF DESCRIPTION OF THE DRAWINGS

FIG. 1A and FIG. 1B are partial cross sectional views of a semiconductor device during the manufacturing process, which is an embodiment of the present invention.

DETAILED DESCRIPTION OF THE PREFERRED EMBODIMENTS

Figure 2:
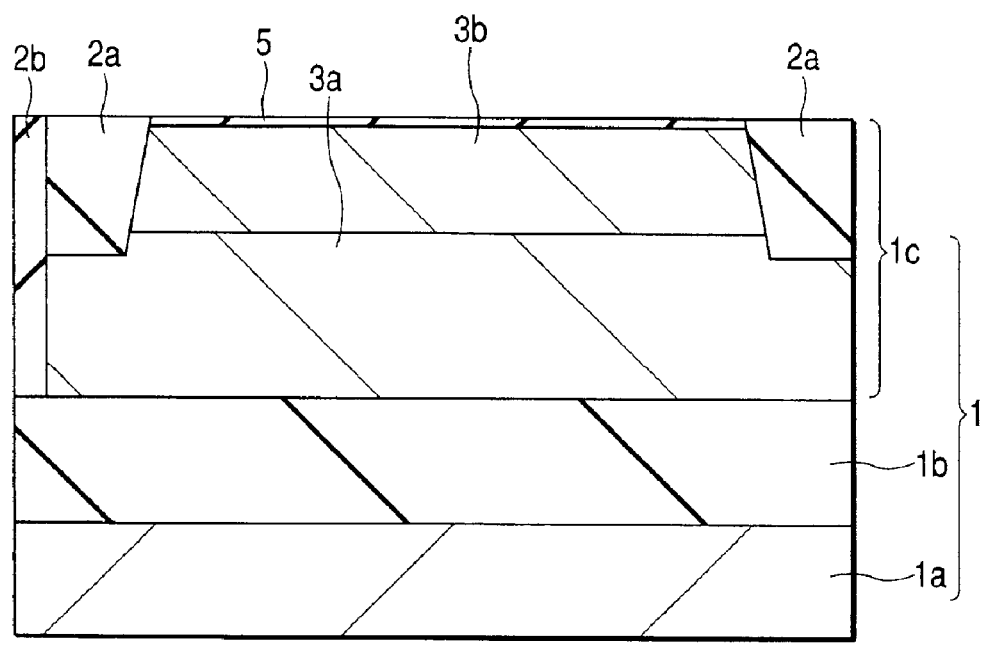
FIG. 2 is a partially enlarged cross sectional view of FIG. 1A.

Though a plurality of divided sections will be described if the divided sections are required to be described individually for convenience in the description of the embodiments hereinafter, these divided sections are not independent of each other, and one section is a part of another section or a modified example of the whole or in relation of detailed or supplemental description excepting the case in which the exception is indicated particularly.

In the embodiment described hereinafter, in the case that the number of elements (including the number, value, quantity, and range) is mentioned, the number of elements is not limited to the mentioned number of elements and the number may be larger than the mentioned number or may be smaller than the mentioned number excepting the case in which the number is specified particularly and the case in which the number is limited to a specified number apparently based on the principle.

Furthermore, in the embodiments described hereinafter, as a matter of course the component (including element step) is not necessarily essential excepting the case in which the component is mentioned particularly and the case in which the component is essential based on the principle.

Similarly, in the embodiments described hereinafter, the configuration of components and the positional relation that are mentioned include the component and the positional relation substantially that are analogous or similar to components and positional relations excepting the case in which the component and the positional relation are mentioned particularly or in the case in which the component and the positional relation do not include apparently the analogous or similar components and positional relation based on the principle. This is true for the above-mentioned value and range.

In all the drawings for description of the embodiments, the component having the same function is given the same character, and the repeated description will be omitted.

In the embodiments described hereinafter, MIS.FET (Metal Insulator Semiconductor Field Effect Transistor) is abbreviated as MIS, and p-channel type MIS.FET is abbreviated as pMIS and n-channel type MIS.FET is abbreviated as nMIS.

The embodiments of the present invention will be described in detail hereinafter with reference to the drawings.

In the embodiments of the present invention, the case in which the present invention is applied to a method for manufacturing a semiconductor device, which is a semiconductor device used for electronic apparatus such as 10 Gb/s or 40 Gb/s optical transmission system (photoelectric transducer), cellular phone, or Bluetooth, having a self-alignment type or HBT configuration bipolar transistor and MIS on the same single semiconductor substrate (simply refer to substrate hereinafter) will be described hereinafter. Herein, an npn-type bipolar transistor for which high operation is required is exemplified as a bipolar transistor and an nMIS is exemplified. However, the present invention is by no means limited to the above-mentioned case. For example, the present invention may be applied to a pnp-type bipolar transistor. A PMIS may be used as the MIS. As a matter of course, the present invention may be applied to the case in which an nMIS and pMIS are both formed on the same single substrate.

FIG. 1A and FIG. 1B are partial cross sectional view of a semiconductor device during manufacturing process. FIG. 1A shows a region on which the above-mentioned bipolar transistor is to be formed, and FIG. 1B shows a region on which the above-mentioned MIS is to be formed. Furthermore, FIG. 2 is a partially enlarged cross sectional view of FIG. 1A.

A substrate 1 consists of, for example, a flat approximately circular SOI (Silicon On Insulator) wafer. In detail, the substrate 1 is provided with a semiconductor layer 1c on a support substrate 1a with interposition of an embedded insulation layer 1b. The support substrate 1a consists of, for example, single crystal silicon (Si) and is served for functioning to secure the mechanical strength of the substrate 1. The embedded insulation layer 1b consists of, for example, silicon oxide ($SiO_x$). The semiconductor layer 1c consists of, for example, single crystal silicon, and an element is formed on the semiconductor layer 1c. The substrate 1 is formed by means of, for example, lamination technique. In detail, two semiconductor wafers (simply refer to wafer hereinafter) consisting of single crystal silicon are laminated with interposition of the embedded insulation layer 1b, and then the back surface of the one wafer is ground and polished, furthermore n-type single crystal silicon is formed on the back surface that has been ground and polished by means of epitaxial growing technique. Therefore, the single crystal silicon layer of the semiconductor layer 1c has a portion that is formed of wafer and a portion that is formed by means of epitaxial growing technique.

A shallow groove type isolation portion (SGI: Shallow Groove Isolation) 2a and a deep groove type isolation (Trench Isolation) 2b are formed on the isolation region of the main surface (surface on which an element is to be formed) of the semiconductor layer 1c. The shallow groove type isolation portion 2a comprises, for example, a silicon oxide film embedded in the shallow groove grooved on the semiconductor layer 1c so as not to contact with the embedded insulation layer 1b. The range of an active region is defined by the shallow groove type isolation portion 2a. Furthermore, the deep groove type isolation portion 2b comprises, for example, a silicon oxide film embedded in the deep groove that is grooved from the top surface of the shallow groove type isolation portion 2a through the isolation portion 2a and semiconductor layer 1c up to the embedded insulation layer 1b. The element regions on the semiconductor layer 1c are electrically isolated completely by the deep groove type isolation portion 2b. The isolation portion 2a is by no means limited to a groove type isolation portion, and the isolation portion 2a may be formed by means of, for example, LOCOS (Local Oxidation of Silicon).

An $N^+$-type collector embedded region 3a is formed on the semiconductor layer 1c in the bipolar transistor forming region (FIG. 1A). The collector embedded region 3a contains, for example, antimony (Sb) An n-type collector region 3b and an $n^+$-type collector leading region 3c are formed on the top layer of the collector embedded region 3a. The n-type collector region 3b is isolated from the $N^+$-type collector leading region 3c by the shallow groove type isolation portion 2a formed between both collector regions 3b and 3c, but both collector regions 3b and 3c are electrically connected through the collector embedded region 3a.

An insulation film 4 consisting of, for example, silicon oxide film is deposited on the semiconductor layer 1c and isolation portions 2a and 2b by CVD (Chemical Vapor Deposition) technique in the bipolar transistor forming region. An aperture 4a is formed on the flat surface of the n-type collector region and the surrounding region that expands to the periphery of the n-type collector region of the insulation film 4. A forward taper having the aperture size that expands larger from the bottom toward the top of the aperture 4a is formed on the side surface of the aperture 4a. An insulation film 5 consisting of, for example, silicon oxide film is formed on the active region surrounded by the shallow isolation portion 2a by means of thermal oxidation technique on the main surface of the semiconductor layer 1c in the aperture 4a (refer to FIG. 2). The thickness of the insulation film 5 is, for example, approximately 6 nm that is a value reduced to the film thickness of silicon dioxide.

On the other hand, a p-well 6a and p-well leading region 6b are formed in the order from the bottom layer on the semiconductor layer 1c in the MIS forming region (FIG. 1B). The p-well 6a and the p-well leading region 6b contain, for example, boron (B). The p-well 6a and the p-well leading region 6b are electrically connected to each other. For example, an nMISQn has been formed already on the p-well 6a. The reason why the nMISQn has been formed already before the bipolar transistor is formed is that an MIS is formed before a bipolar transistor having high-low difference is formed to thereby make the gate electrode of the MIS to be worked easily generally. The insulation film 4 is deposited so as to cover the nMISQn on the semiconductor layer 1c in the MIS forming region.

The nMISQn has n-type semiconductor regions 7 and 7 for serving as a source and drain, a gate insulation film 8, and a gate electrode 9. The channel of the nMISQn is formed just under the gate electrode 9 between the source n-type semiconductor region 7 and the drain n-type semiconductor region 7. The n-type semiconductor regions 7 and 7 are formed on the surface layer of the p-well 6a, and have a first region 7a and second region 7b. The first and second regions 7a and 7b are connected electrically to each other. The first region 7a is formed adjacent to the channel of the nMISQn. Furthermore, the second region 7b is formed distant in the plane by a length of the first region 7a from the channel. The first and second regions 7a and 7b both contain, for example, phosphor or arsenic (As), and the impurity concentration of the first region 7a is lower than that of the second region 7b in this case. In other words, the first and second regions have so-called LDD (Lightly Doped Drain) structure. The gate insulation film 8 comprises, for example, a silicon oxide film. However, the gate insulation film 8 may comprise an oxide-nitride film. In other words, a structure in which nitrogen is segregated on the interface between the gate insulation film 8 and the semiconductor layer 1c may be employed. Thereby, it is possible to improve the hot carrier resistance of the nMISQn. The gate electrode 9 comprises a single film consisting of, for example, n-type polycrystalline silicon at that stage. For example, a side wall 10 comprising, for example, an oxide silicon film is formed on the side surface of the gate electrode 9.

The same forming method as used for forming a usual MIS is used to form the nMISQn. In detail, the nMISQn is formed according to the method described herein under exemplarily. At first, the substrate 1 is subjected to thermal oxidation treatment to form a gate insulation film 8 comprising a silicon oxide film on the semiconductor layer 1c. Subsequently, the substrate 1 is subjected to heat treatment in an atmosphere of, for example, nitrogen oxide (NO) or dinitrogen monoxide (N₂O) to segregate nitrogen on the interface between the gate insulation film 8 and the semiconductor layer 1c, and the gate insulation film 8 consisting of dinitrogen monoxide may be obtained. Thereafter, an n-type polycrystalline silicon film is deposited on the semiconductor layer 1c including the gate insulation film 8, and the polycrystalline silicon film is patterned by means of photolithography technique and dry etching technique to form the gate electrode 9. Next, for example, phosphor or arsenic is ion-injected into the semiconductor layer 1c to form the first region 7a. In the case that a p-type MIS is formed, boron or boron difluoride (BF₂) is ion-injected instead of phosphor or arsenic. Thereafter, an insulation film comprising, for example, a silicon oxide film is deposited on the semiconductor layer 1c by means of CVD technique, and the insulation film is etched by means of dry etching technique to form the side wall 10 on the side surface of the gate electrode 9. Furthermore, for example, phosphor or arsenic is ion-injected into the semiconductor layer 1c to form the second region 7b. In the case that a pMIS is formed, boron or boron difluoride is ion-injected instead of phosphor or arsenic in the same manner as described hereinabove. As the result, the nMISQn is formed. Otherwise, in the case that a PMIS is formed, the n-well and n-well leading regions are formed on the semiconductor layer 1c instead of the p-well 6a and p-well leading region 6b. In this case, for example, phosphor or arsenic is ion-injected. Furthermore, a p-type gate electrode 9 is employed to thereby make the pMIS channel as the surface channel. The channel of the surface channel is formed on the interface portion between the gate insulation film 8 located under the gate electrode 9 and the semiconductor layer 1c on the region between the source and drain semiconductor regions of the MIS.

Figure 3:
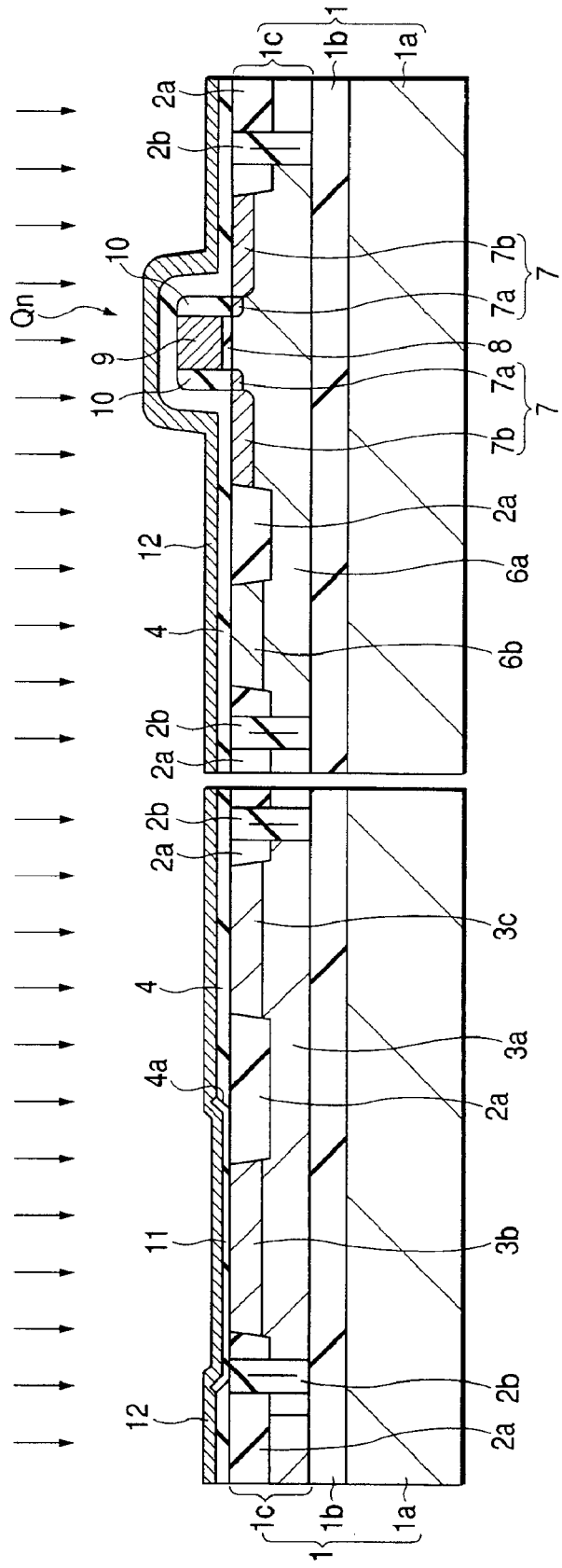
FIG. 3A and FIG. 3B are partial cross sectional views of the semiconductor device during the manufacturing process subsequent to FIG. 1A and FIG. 1B.
Figure 4:
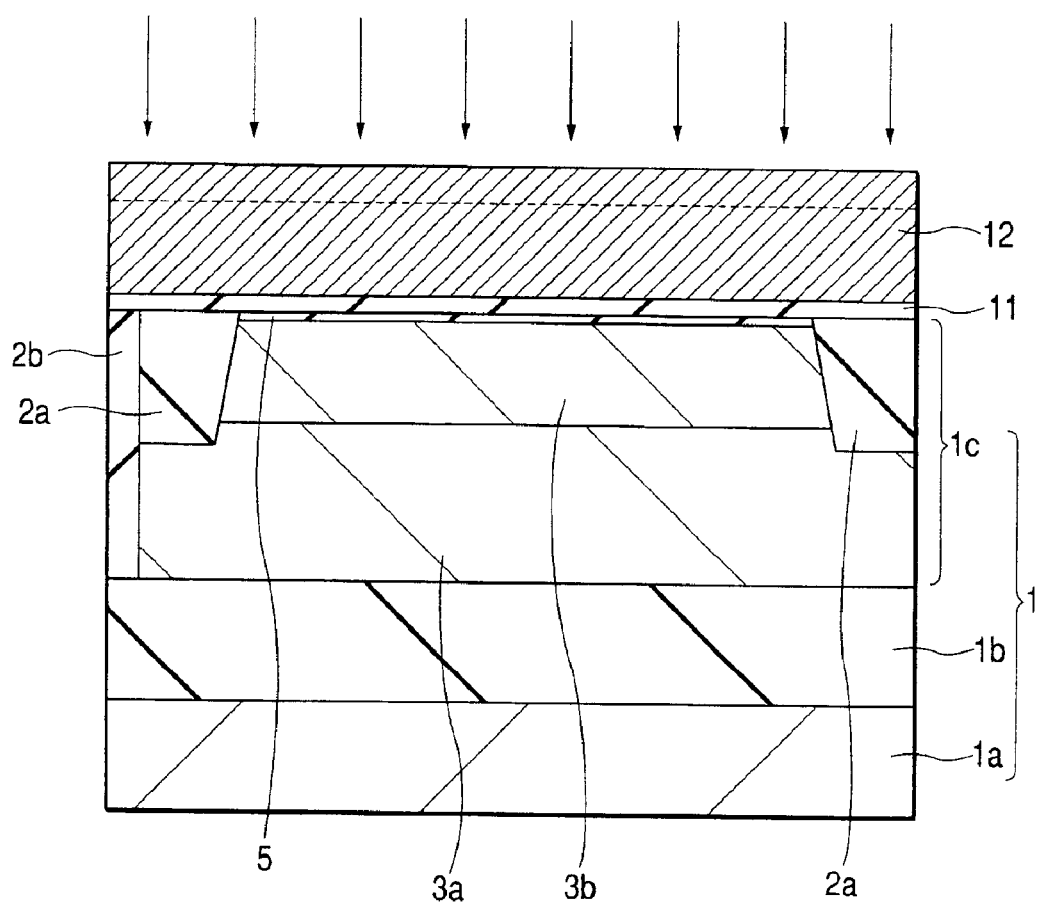
FIG. 4 is a partially enlarged cross sectional view of FIG. 3A.

Next, FIG. 3A and FIG. 3B are a partially cross sectional views showing a semiconductor device during the manufacturing process subsequent to FIG. 1A and FIG. 1B, and FIG. 4 is a partially enlarged cross sectional view of FIG. 3A.

Herein, at first, an insulation film comprising a silicon nitride (Si$_x$N$_y$) film having a thickness of, for example, 50 nm on the substrate (the main side of the semiconductor layer 1c) is deposited by means of CVD technique, and the insulation film is patterned by means of photolithography technique and dry etching technique so that the insulation film is removed excepting only the insulation film in the aperture 4a to thereby form the insulation film (first insulation film) 11 comprising a silicon nitride film in the aperture 4a. Subsequently, a base electrode forming film 12 comprising a non-doped polycrystalline silicon film having a thickness of, for example, approximately 200 nm is deposited on the insulation films 4 and 11 as the conductive film by means of CVD technique, and, for example, boron is ion-injected into the base electrode forming film 12. At that time, boron is ion-injected only into the top of the base electrode forming film 12, but not ion-injected into the base electrode forming film 12 through the entire depth of the base electrode forming film 12 in this stage. A broken line in FIG. 4 schematically shows the ion-injection of boron. Boron is ion-injected and penetrates from the top surface of the base electrode forming film 12 up to the broken line. Therefore, the acceleration energy for ion-injection is suppressed to a low value of, for example, approximately 10 keV. As described hereinabove, the base electrode forming film 12 comprises a silicon film, namely a semiconductor film.

Figure 5:
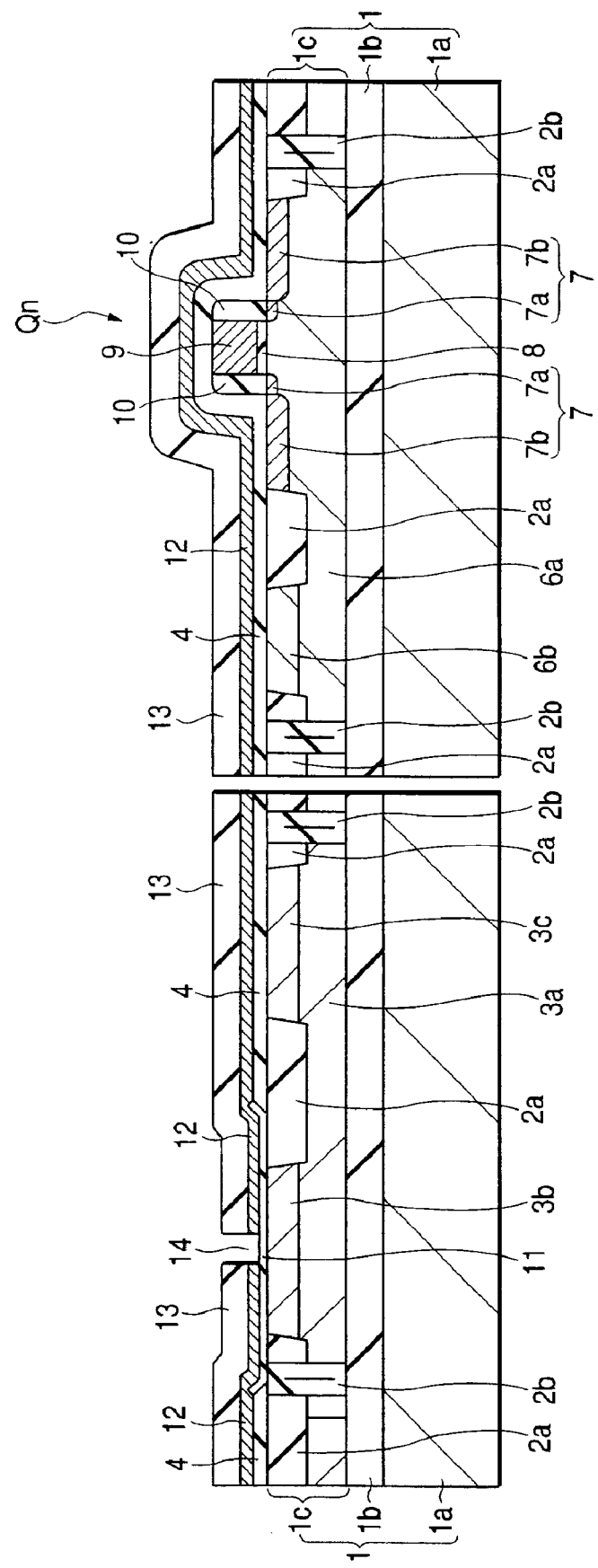
FIG. 5A and FIG. 5B are partial cross sectional views of the semiconductor device during the manufacturing process subsequent to FIG. 3A and FIG. 3B.
Figure 6:
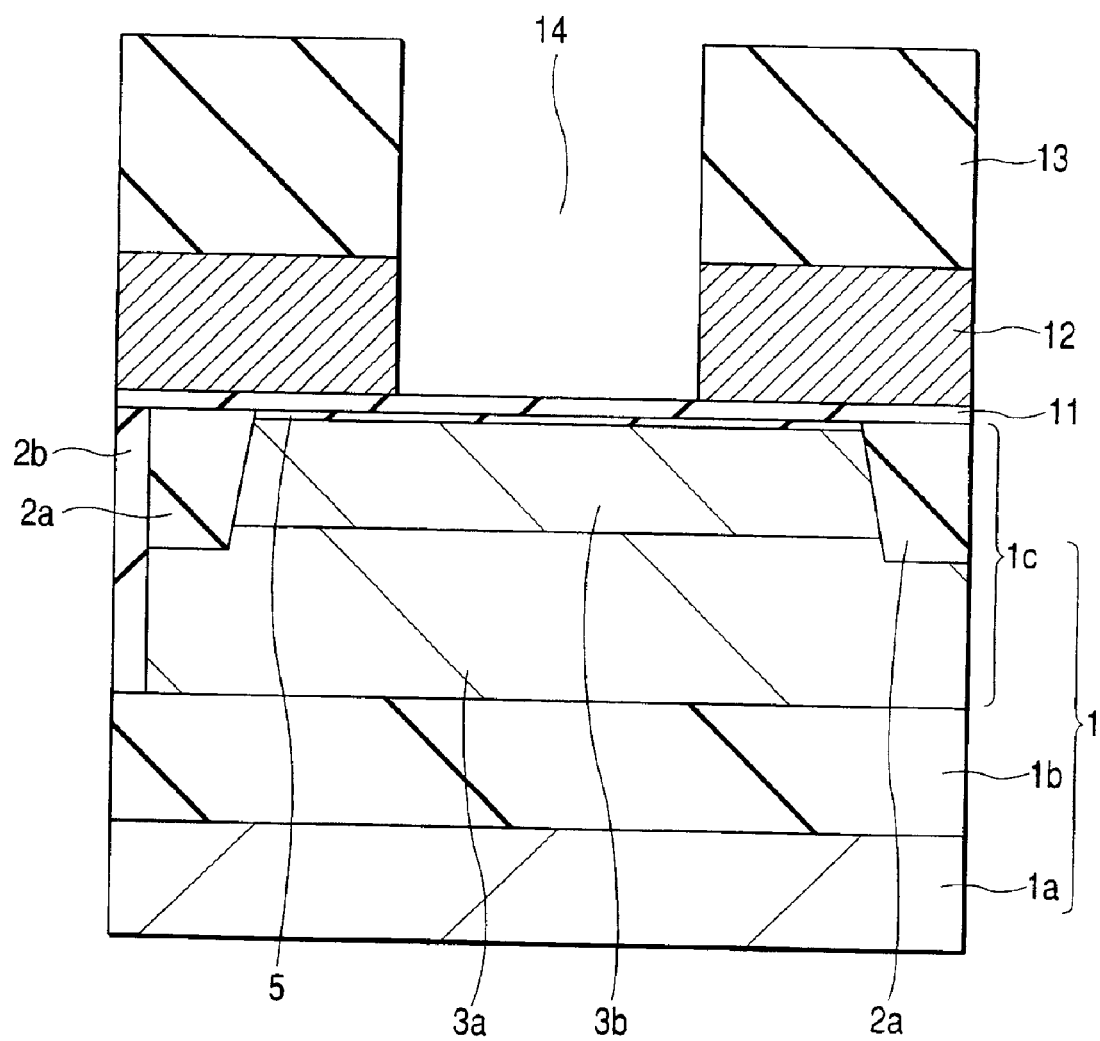
FIG. 6 is a partially enlarged cross sectional view of FIG. 5A.

Next, FIG. 5A and FIG. 5B show partially cross sectional view of the semiconductor device during the manufacturing process subsequent to FIG. 3A and FIG. 3B, and FIG. 6 is a partially enlarged cross sectional view of FIG. 5A.

Herein, at first, an insulation film (first silicon oxide film, second insulation film) 13 comprising, for example, a silicon oxide film is deposited on the base electrode forming film 12 by means of CVD technique, and the insulation film 13 and a part of the base electrode forming film 12 in the plane of the n-type collector region 3b are removed by means of photolithography technique and dry etching technique in the bipolar transistor forming region to thereby form an emitter aperture 14. The above-mentioned insulation film 11 is exposed to the bottom surface of the emitter aperture 14. Furthermore, the above-mentioned base electrode forming film 12 is exposed to the side surface of the emitter aperture 14. Planer size of the emitter aperture is, for example, approximately 0.35 μm×approximately 2.0 μm.

Figure 7:
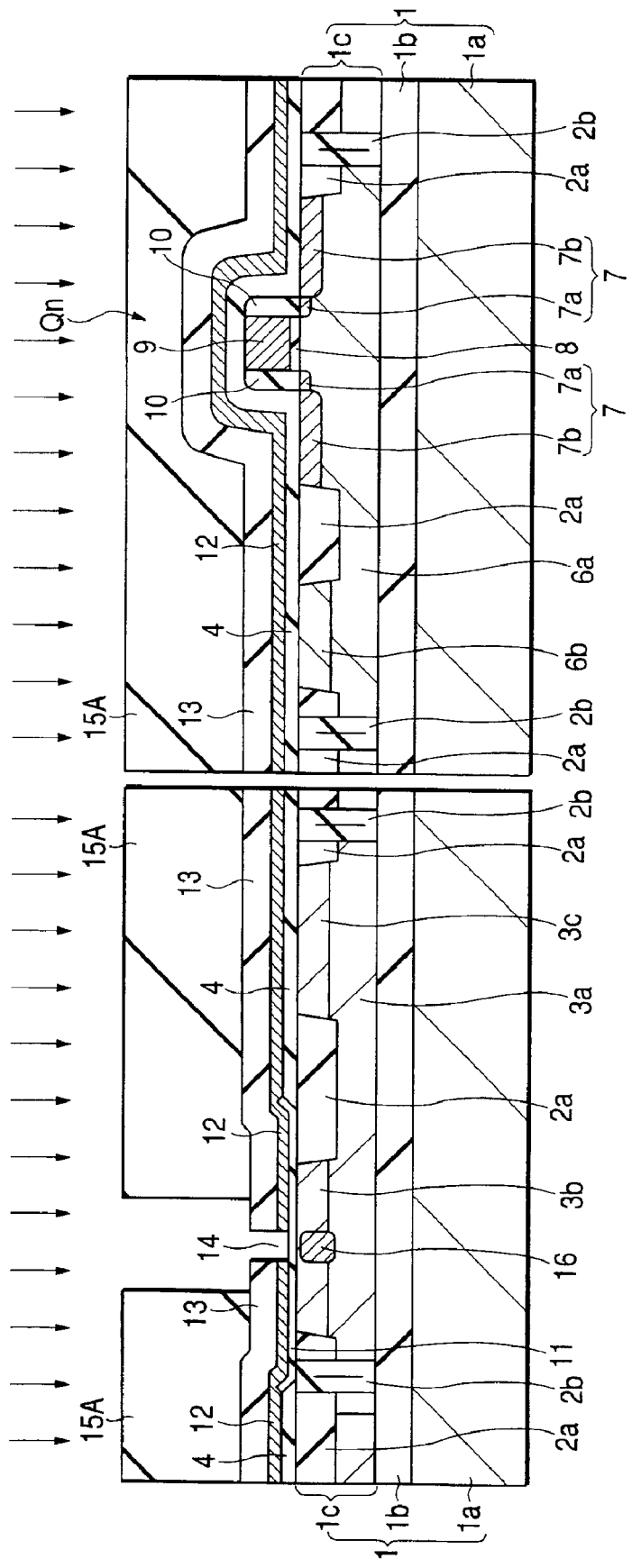
FIG. 7A and FIG. 7B are partial cross sectional views of the semiconductor device during the manufacturing process subsequent to FIG. 5A and FIG. 5B.

Next, FIG. 7A and FIG. 7B are partial cross sectional views of the semiconductor device during the manufacturing process subsequent to FIG. 5A and FIG. 5B.

Herein, a photoresist (simply refer to resist film hereinafter) film 15A is formed on the insulation film 13 by means of photolithography technique. The resist film 15A is formed so as to expose the emitter aperture 14 and cover the region other than the emitter aperture 14. Subsequently, the first ion injection is carried out to form SIC (Selective Implanted Collector) region 16. In detail, for example, phosphor is ion-injected to the semiconductor layer 1c under the condition of 200 KeV and 5×10$^{12}$ cm$^{-2}$ with the resist film 15A being used as an ion injection mask. Thereby, the frequency characteristic of the bipolar transistor is more improved.

Figure 8:
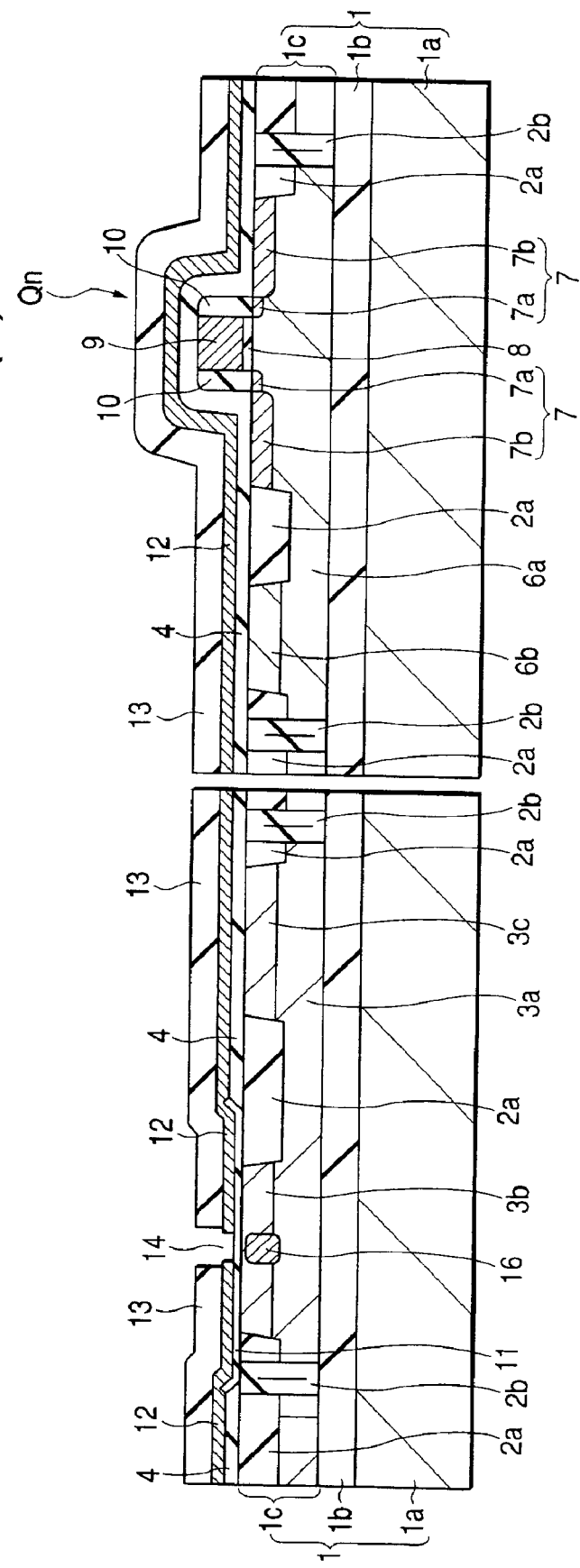
FIG. 8A and FIG. 8B are partial cross sectional views of the semiconductor device during the manufacturing process subsequent to FIG. 7A and FIG. 7B.
Figure 9:
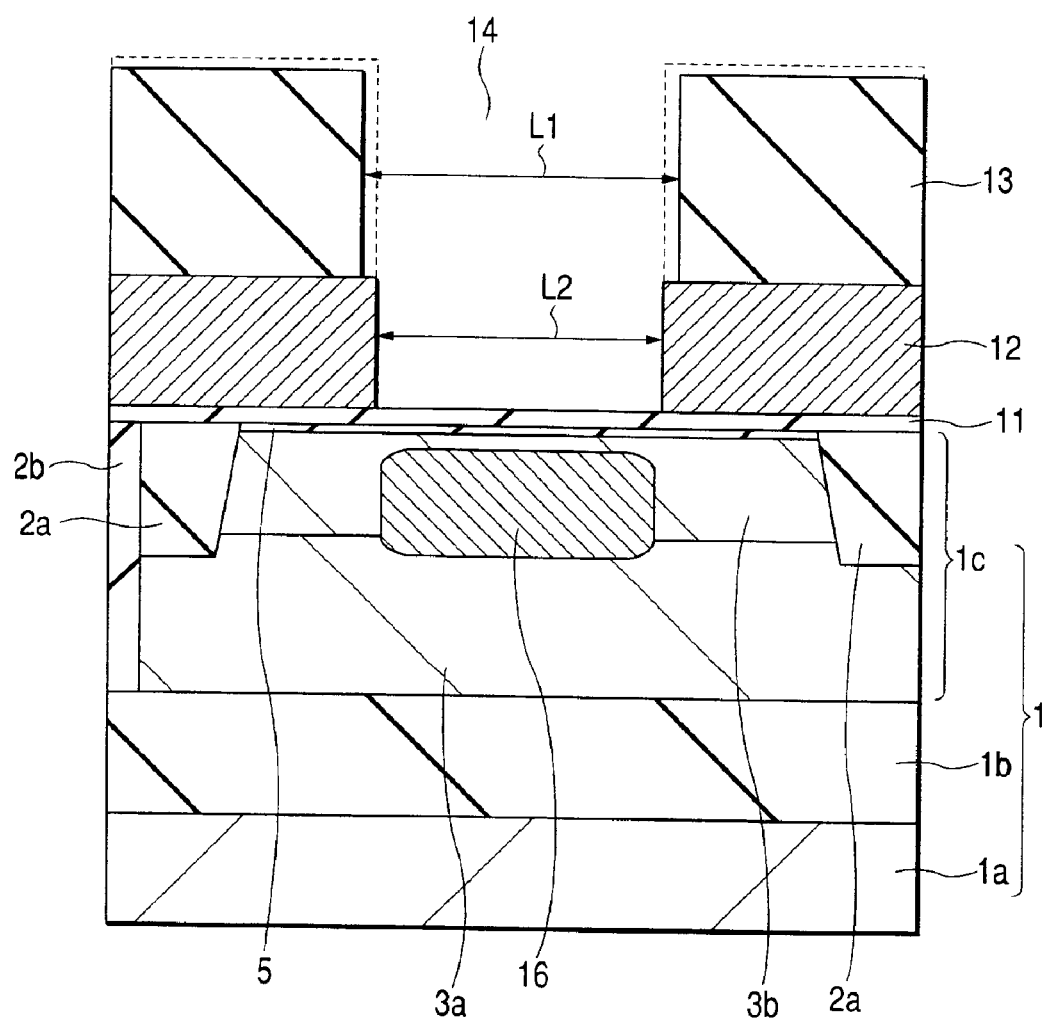
FIG. 9 is a partially enlarged cross sectional view of FIG. 8A.

Next, FIG. 8A and FIG. 8B are partial cross sectional views of the semiconductor device during the manufacturing process subsequent to FIG. 7A and FIG. 7B, and FIG. 9 is a partially enlarged cross sectional view of FIG. 8A.

Herein, the resist film 15A is removed, and then the substrate 1 is cleaned by use of diluted hydrofluoric acid. At that time, approximately 20 nm depth from the surface of the insulation film 13 is etched (refer to the broken line shown in FIG. 9). As the result, the aperture width L1 of the insulation film 13 in the emitter aperture 14 is wider than the aperture width L2 of the base electrode forming film 12 in the emitter aperture 14 by approximately 40 nm. The top corner (shoulder) of the base electrode forming film 12 is slightly exposed to the emitter aperture 14.

Figure 10:
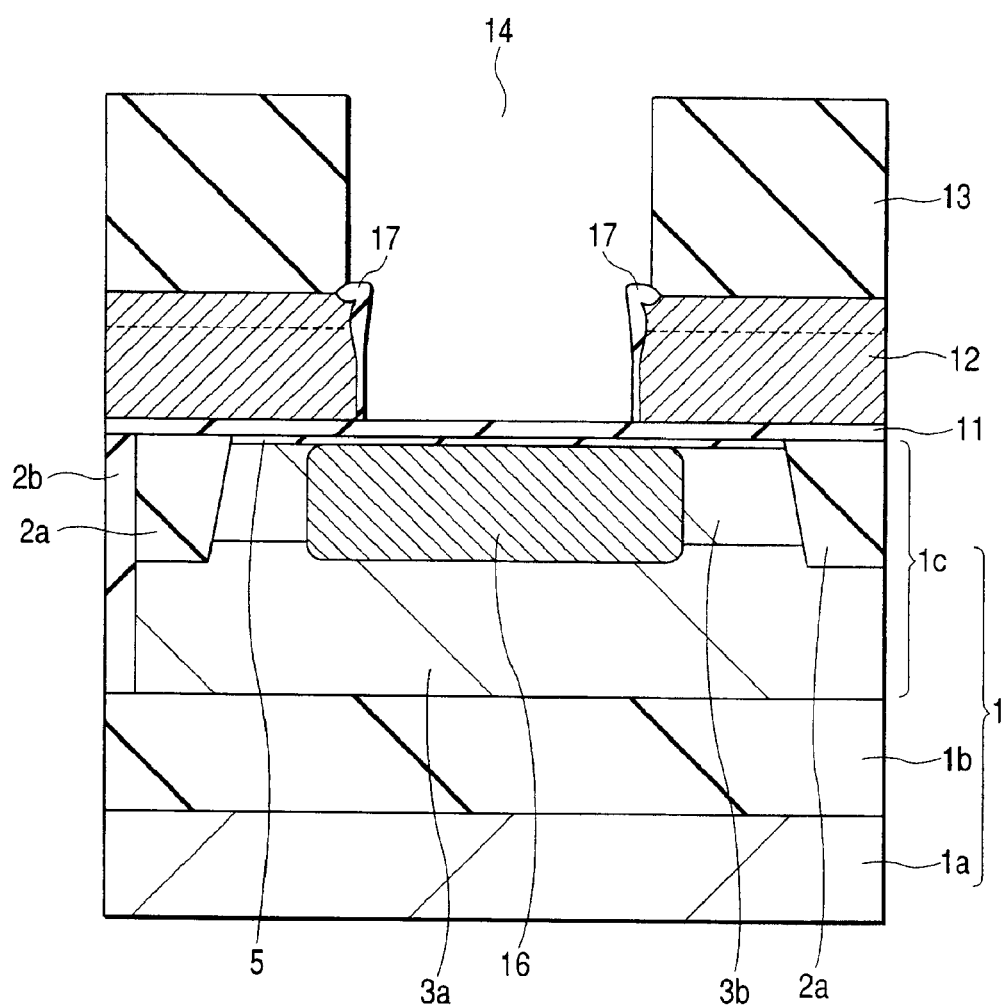
FIG. 10 is a partially enlarged cross sectional view of the semiconductor device during the manufacturing process subsequent to FIG. 9.

Next, FIG. 10 is a partially enlarged cross sectional view of the semiconductor device during the manufacturing process subsequent to FIG. 9. The broken line shown on the base electrode forming film 12 shown in FIG. 10 schematically shows the boron injection range as in the case of the broken line shown in FIG. 4.

Herein, for example, the substrate 1 is subjected to heat treatment at 800° C. in a mixed gas containing, for example, oxygen (O₂)/hydrogen (H₂)=2:1 for approximately 20 minutes. As the result, for example, an insulation film (second silicon oxide film) 17 comprising a silicon oxide film is formed on the side wall of the base electrode forming film 12 that is exposed in the emitter aperture 14. The insulation film 17 functions as a protection film during selective epitaxial growing as described hereinafter.

However, the oxidation rate of the pattern edge (the shoulder of the base electrode forming film 12 exposed from the emitter aperture 14) is slow generally during oxidation treatment and the insulation film 17 becomes thin at that portion. The thickness of the insulation film 17 at the shoulder portion of the base electrode forming film 12 is secured not sufficiently and the portion of the base electrode forming film 12 is exposed from the emitter aperture 14. The exposure causes growth of an epitaxial layer from the exposed portion of the base electrode forming film 12 during epitaxial growth as described hereinafter, and it causes a problem. To avoid the problem, heat treatment at relatively high temperature is required to secure the thickness of the insulation film 17. However, such heat treatment can result in diffusion of impurity in the n-type semiconductor region 7 for the source and the drain of the nMISQn that has been formed already on the substrate 1. On the other hand, because boron is ion-injected into the top surface of the base electrode forming film 12 as described with reference to FIG. 3 and FIG. 4 in the present embodiment, oxidation is accelerated at the shoulder of the base electrode forming film 12 that is exposed from the emitter aperture 14 during heat treatment, and as the result the oxidation rate becomes higher at the shoulder. Therefore, the thickness of the insulation film 17 is so thick as approximately 35 nm on the doping layer of the base electrode forming film 12 where the boron concentration is high, and on the other hand the thickness of the insulation film 17 is so thin as approximately 10 nm on the portion into which boron has diffused not sufficiently. In other words, the insulation layer 17 having a sufficient thickness is formed at the shoulder of the base electrode forming film 12 exposed from the emitter aperture 14 by means of heat treatment at a relatively low temperature. According to an image obtained actually by inventors of the present invention with a SEM (scanning electron microscope), it has been found that the thickness of the silicon oxide at the bottom portion on the side wall of the base electrode forming film 12 into which boron does not diffuse is different from that at the top portion into which boron is introduced. As described hereinabove, boron impurity is diffused so that the boron concentration is higher at the top portion of the base electrode forming film 12 than that at the bottom portion of the base electrode forming film 12. Thereby, the thickness of the insulation film 17 can be formed sufficiently thick at the shoulder of the base electrode forming film 12.

CVD process and dry etching process of a silicon nitride film are necessary for the technique that the inventors of the present invention has developed when a protection film is formed, and the process is complex. On the other hand, only thermal oxidation process of a protection film (insulation film 17) is necessary for the present embodiment, and the process is simple. In other words, the manufacturing time of a semiconductor device is shortened. Furthermore, the cost of a semiconductor device can be reduced.

Furthermore, because dry etching process of a silicon nitride film is necessary when the protection film is formed for the technique that has been studied by the inventors of the present invention, the light element can cause damage of the semiconductor layer 1c as described hereinabove, and the crystallinity of an epitaxial growth film is deteriorated disadvantageously during selective epitaxial growing process as described hereinafter. On the other hand, in the present embodiment, the protection film (insulation film 17) is formed by means of thermal oxidation treatment without dry etching treatment. As the result, the semiconductor layer 1c is prevented from being damaged because the protection film is formed without dry etching treatment. Therefore, because the crystallinity of the epitaxial growth film is improved during selective epitaxial growing process as described hereinafter, the performance of the bipolar transistor is improved. In particular, because the leak current between base collectors are suppressed or prevented, it is possible to reduce the power consumption during waiting of the bipolar transistor.

Furthermore, the heat treatment functions to diffuse boron introduced from the top surface of the base electrode forming film 12 into the base electrode forming film 12 to some extent. Herein, boron is diffused so as not to reach to the insulation film 11. However, as described in the present embodiment, because the thermal treatment temperature can be lowered by use of accelerated oxidation, the impurity of the n-type semiconductor region 7 for source and drain of the nMISQn that has been formed on the substrate 1 will not be diffused though the thermal treatment is carried out. In other words, because the reformation of the impurity profile on the MIS side is suppressed or prevented, it is possible to suppress or prevent the change or deterioration of the electric performance of the MIS. Therefore, the reliability of the nMISQn is secured. The same effect can be obtained also in the case that a pMIS, CMIS (Complementary MIS), or other elements is formed on the substrate 1.

Figure 11:
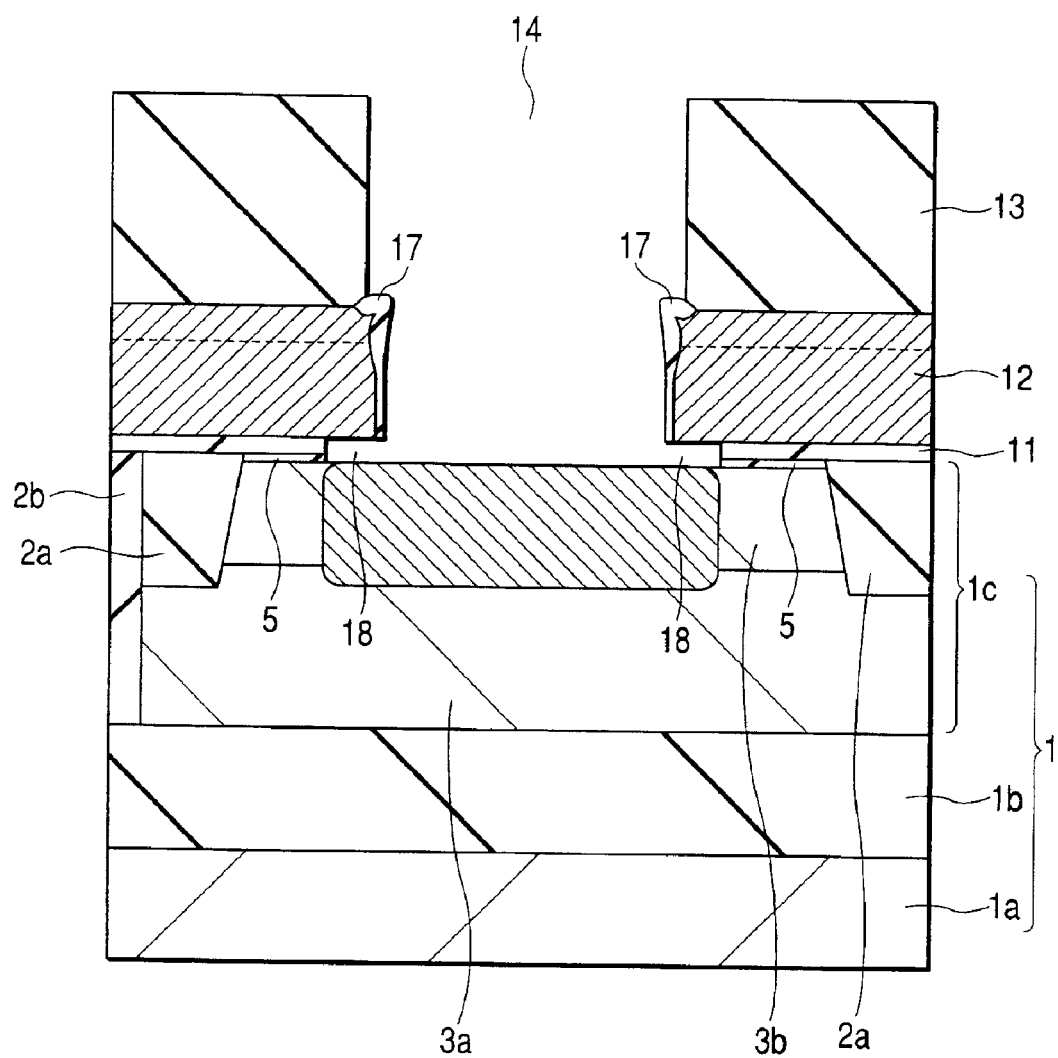
FIG. 11 is a partially enlarged cross sectional view of the semiconductor device during the manufacturing process subsequent to FIG. 10.

Next, FIG. 11 is a partially enlarged cross sectional view showing the semiconductor device during the manufacturing process subsequent to FIG. 10.

Herein, at first, for example, the insulation film 11 comprising a silicon nitride film located on a bottom of the emitter aperture 14 is removed with hot phosphoric acid. At that time, a part of the insulation film 11 located under the end of the base electrode forming film 12 is removed by means of etching to form an under cut 18 by applying over etching treatment as shown in FIG. 11. In other words, the insulation film 11 is etched in isotropic fashion so that the side surface of the insulation film 11 in the emitter aperture 14 is recessed from the side surface of the base electrode forming film 12. Thereby, a wider second aperture that is continuous to the emitter aperture (the first aperture) 14 is formed under the emitter aperture 14. The recess formed by etching in the horizontal direction of the under cut portion 18 (in the direction along the main plane of the semiconductor layer 1c) is, for example, approximately 60 nm. A part of end bottom surface of the base electrode forming film 12 is exposed to the under cut portion 18. The main surface portion of the semiconductor layer 1c is protected by the insulation film 5 consisting of a silicon oxide film in the wet etching treatment with hot phosphoric acid. In detail, in the wet etching treatment, the etching rate difference between a silicon nitride film and a silicon oxide film is approximately 30, the cutting length of the insulation film 5 is approximately 2 nm and does not cause a problem though the over etching length of the silicon nitride film is 60 nm.

Subsequently, the insulation film 5 is removed by means of wet etching treatment with diluted hydrofluoric acid. Herein, the insulation film 17 comprises a silicon oxide film that is the same material of the insulation film 11, but because the thickness of the insulation film 17 is thicker than that of the insulation film 11, the insulation film 17 is not removed completely and approximately 4 nm of the insulation film 17 remains after wet etching with diluted hydrofluoric acid.

Figure 12:
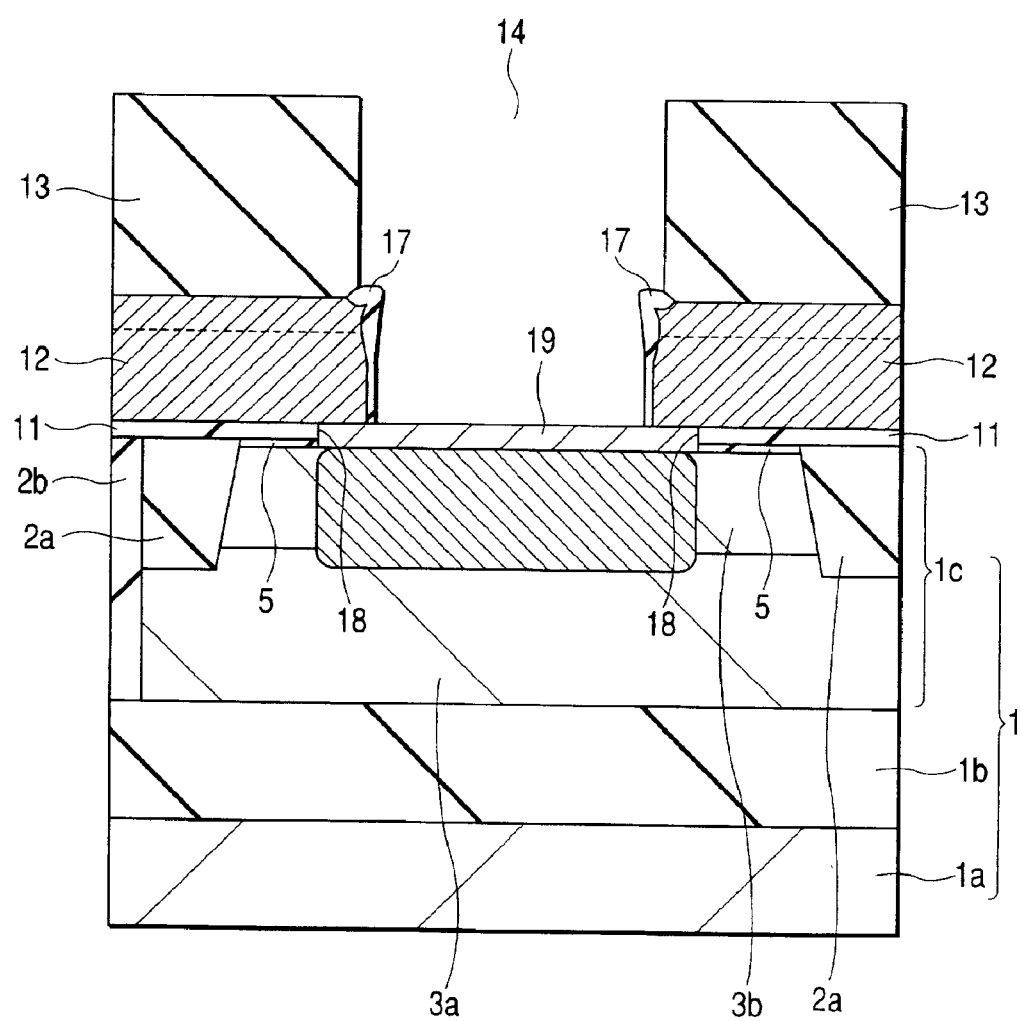
FIG. 12 is a partially enlarged cross sectional view of the semiconductor device during the manufacturing process subsequent to FIG. 11.

Next, FIG. 12 is a partially enlarged cross sectional view of the semiconductor device during the manufacturing process subsequent to FIG. 11.

Herein, at first, the substrate 1 is subjected to heat treatment, for example, at a temperature of 900° C. for 1 minute in high purity $H_2$ purge atmosphere to remove the natural oxide film formed on the semiconductor layer 1c in the emitter aperture 14. Thereafter, for example, an epitaxial layer 19 having a thickness of 70 nm is formed selectively on the semiconductor layer 1c by means of, for example, LP-CVD (Low Pressure-Chemical Vapor Deposition) technique at a temperature of 650° C. to 800° C. The epitaxial layer 19 comprises, for example, an i(intrinsic)-SiGe, a p-type SiGe, and an i(intrinsic)-Si that are laminated in the order from the bottom, and the epitaxial layer 19 is served as the base region of the npn-type bipolar transistor. Boron is introduced into the p-type SiGe, and the concentration is, for example, approximately $2\times10^{19}$ cm$^{-3}$. The epitaxial layer 19 is formed so as to embed the under cut portion 18, and connected to the base electrode forming film 12 through the under cut portion 18. During the selective SiGe growing, for example, $SiH_2Cl_2$, $SiH_4$, HCl, $GeH_4$, $B_2H_6$, or $H_2$ is used as the material gas. The gas diffuses into the base electrode forming film 12 during the heat treatment, and reaches the insulation film 11. Thereby, the base electrode forming film 12 is converted to a low resistant p-type polycrystalline silicon film. Boron in the base electrode forming film 12 distributes so that the boron concentration is higher on the upper side and is lower on the bottom side near the semiconductor layer 1c.

In the technique that has been developed by the inventors of the present invention, a silicon nitride film is provided as the protection film partially on the region on which SiGe layer is not grown when the SiGe layer is selectively grown by means of epitaxial growing technique. On the other hand, in the present embodiment, a silicon oxide film is provide as the protection film for the SiGe layer.

Figure 13:
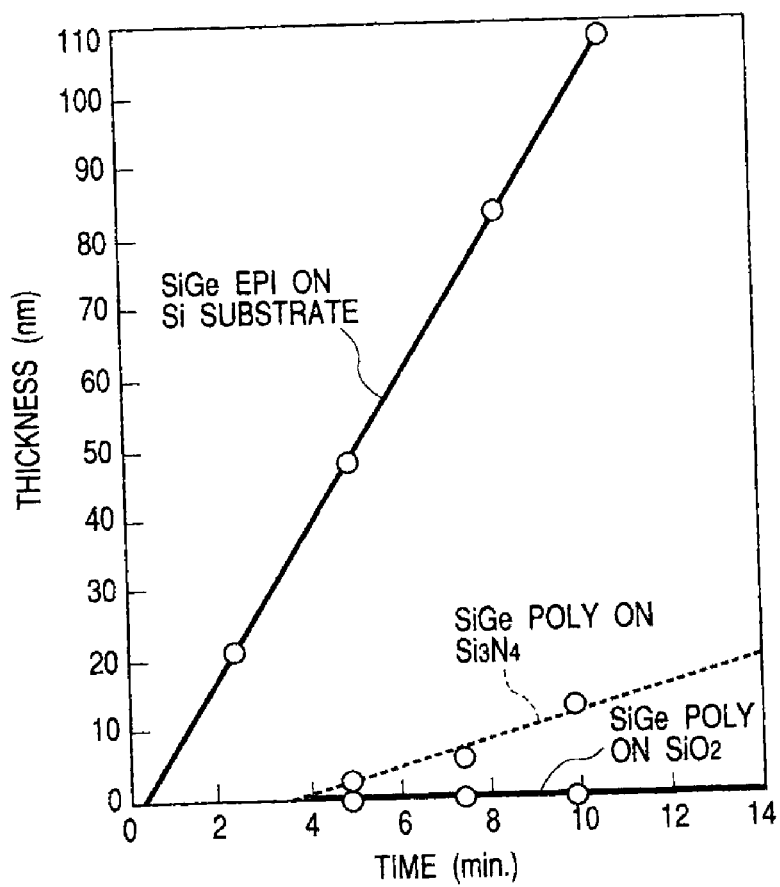
FIG. 13 is a graph for showing the growing rate difference of SiGe layer between various under layers when an epitaxial SiGe layer is grown

Herein, FIG. 13 shows growing rate difference of the SiGe layer on various under layers when an SiGe layer is grown by means of epitaxial technique. As it is obvious from FIG. 13, an SiGe layer is grown only little on a silicon oxide film. In other words, the growing rate of SiGe layer on a silicon oxide film is 0. Therefore, it is found that the use of a silicon oxide film as the protection film is better than the use of a silicon nitride film for selective growing of SiGe.

Actually, in the case that a silicon nitride film is used as the protection film for the SiGe layer, HCl gas flow rate is increased to secure the selective SiGe growing when a SiGe layer is grown selectively. However, the increased HCl gas flow rate reduces the growing rate of SiGe layer on a silicon layer, and as the result leads to increased heat treatment when SiGe is grown. The increased heat treatment during SiGe growing promotes the diffusion of impurity such as Ge or boron in the film, and causes the reduced electric performance such as shutdown frequency characteristic of a bipolar transistor.

On the other hand, in the present embodiment, because the selectivity of SiGe layer is secured sufficiently as shown in FIG. 13 by protecting the silicone oxide film when the SiGe layer is grown selectively, the HCl gas flow rate can be reduced. As the result, an SiGe layer can be grown at a low temperature. Therefore, because the reformation of impurity profile on the MIS side is suppressed or prevented as described hereinabove, it is possible to suppress or prevent the electric performance change or deterioration of MIS.

In the above, the main element of the epitaxial layer 19 is by no means limited to SiGe, and various modifications can be applied. For example, Si or silicon-germanium-carbon (SiGeC) may be used. In the case of Si, i (intrinsic)-Si, a p-type Si, and i (intrinsic) -Si are grown in the order from the bottom layer to form the epitaxial layer 19. Otherwise in the case of SiGeC, i (intrinsic) -SiGeC, a p-type SiGeC, and an i (intrinsic)-Si are grown in the order from the bottom layer to form the epitaxial layer 19. In the case that the main element of the epitaxial layer 19 is an SiGe layer, the shutdown frequency characteristic (fT) and current amplification factor (hFE) are improved in comparison with the case in which the main element of the epitaxial layer 19 is Si. Furthermore, in the case of Si, the temperature characteristic is improved. Furthermore, in the case of SiGeC, because the Ge concentration can be increased in comparison with the case of SiGe, the shutdown frequency characteristic and current amplification factor can be improved.

Figure 14:
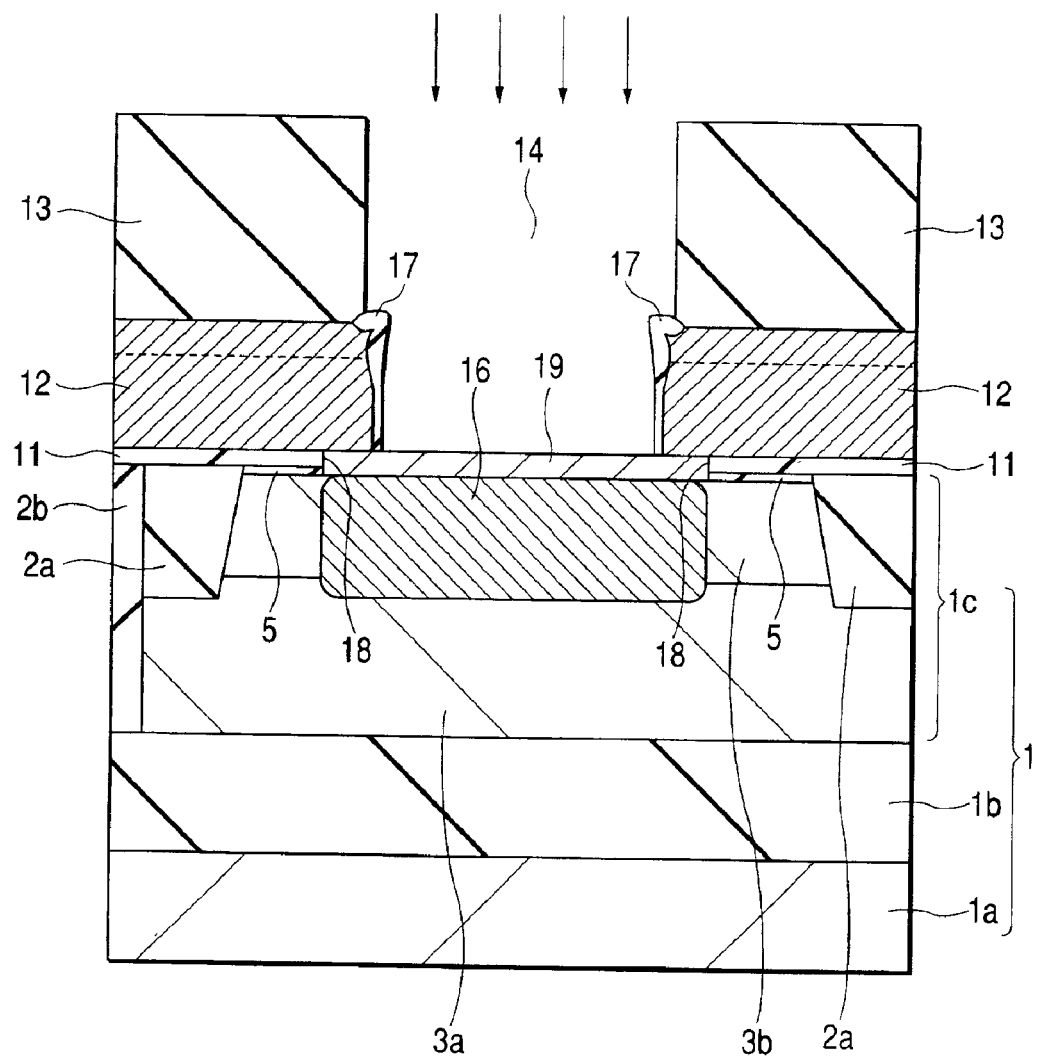
FIG. 14 is a partially enlarged cross sectional view of the semiconductor device during the manufacturing process subsequent to FIG. 12.

Next, FIG. 14 is a partially enlarged cross sectional view of the semiconductor device during the manufacturing process subsequent to FIG. 12. Herein, a thin insulation film is formed on the semiconductor layer 1c by means of CVD technique, the emitter aperture 14 is exposed on the insulation film 13, a resist film is formed so as to cover the region excepting the emitter aperture 14, and the second ion injection is carried out to form the SIC region 16. For example, ions of phosphor are injected under the condition of 70 KeV and $20\times10^{12}$ cm$^{-2}$. Phosphor ions are injected so as to be injected into the semiconductor layer 1c and the iSiGe layer of the epitaxial layer 19.

Figure 15:
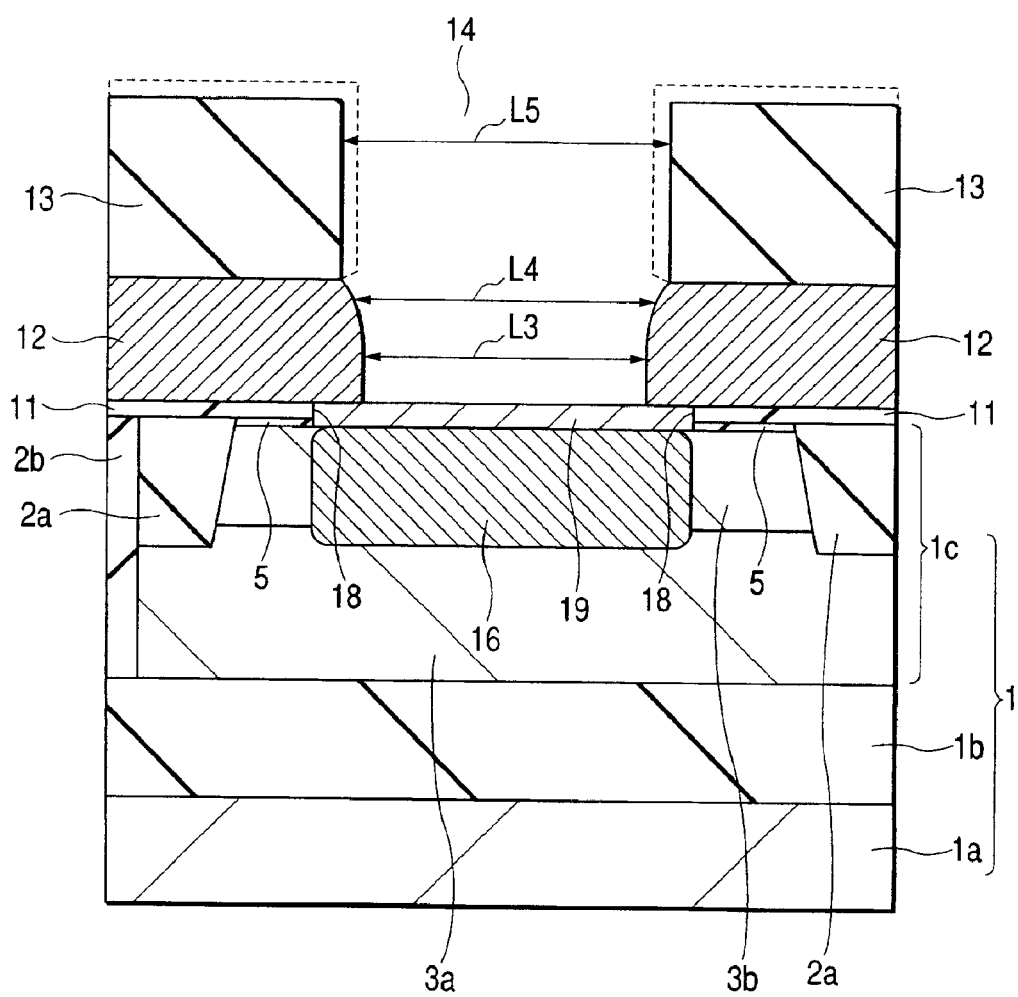
FIG. 15 is a partially enlarged cross sectional view of the semiconductor device during the manufacturing process subsequent to FIG. 14.

Next, FIG. 15 is a partially enlarged cross sectional view of the semiconductor device during manufacturing process subsequent to FIG. 14.

Herein, for example, the insulation film 17 formed on the side wall of the emitter aperture 14 (refer to FIG. 14) is removed by wet etching with diluted hydrogen fluoride. As described hereinabove, the insulation film 17 has been formed so that the thickness is increasing from the bottom of the base electrode forming film 12 (the epitaxial layer 19 side) toward the top edge (the insulation film 13 side). Therefore, the aperture width of the base electrode forming film 12 in the emitter aperture 14 is formed so as to increase from the bottom toward the top by removing the insulation film 17. Furthermore, a round taper is formed at the top edge of the side wall of the base electrode forming film 12. Furthermore, because the insulation film 13 on the base electrode forming film 12 comprises a silicon oxide film similar to the insulation film 17, the surface layer of the insulation film 13 is also etched by, for example, approximately 30 nm. The broken line shown in FIG. 15 shows the portion that has been etched. Therefore, the aperture width in the emitter aperture 14 is wider from the bottom toward the top. For example, in the case that the aperture width L3 of the base electrode forming film 12 in the emitter aperture 14 is, for example, approximately 350 nm, the aperture width L4 of the doping layer located at the top of the base electrode forming film 12 is estimated to be, for example, approximately 375 nm. Furthermore, the aperture width L5 is, for example, approximately 400 nm at the position of the insulation film 13 in the emitter aperture 14.

Figure 16:
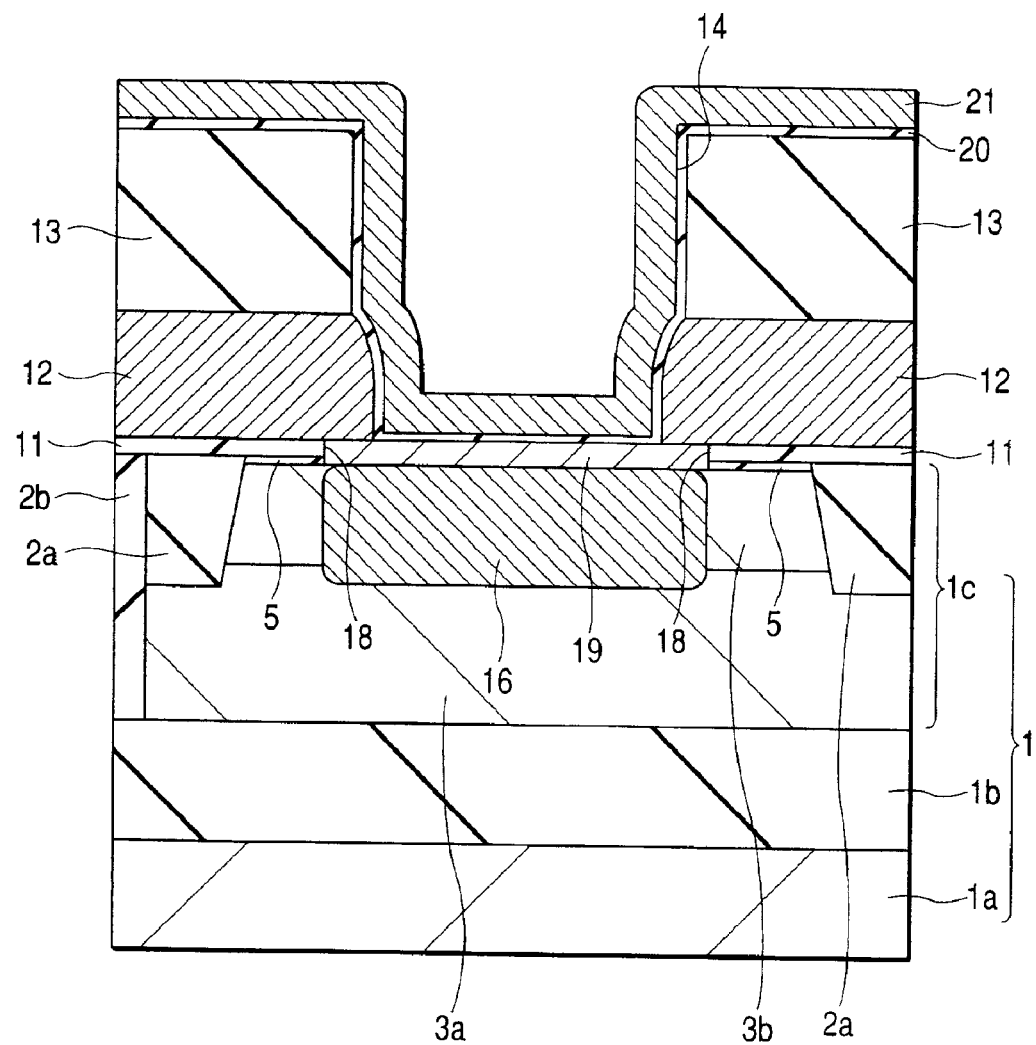
FIG. 16 is a partially enlarged cross sectional view of the semiconductor device during the manufacturing process subsequent to FIG. 15.

Next, FIG. 16 is a partially enlarged cross sectional view of the semiconductor device during the manufacturing process subsequent to FIG. 15. Herein, an insulation film (third silicon oxide film) 20 comprising a silicon oxide film having a thickness of, for example, approximately 30 nm and a conductor film (first polycrystalline silicon film) 21 comprising a phosphor-doped polycrystalline silicon film having a thickness of, for example, approximately 80 nm are deposited in the order from the bottom on the main surface of the semiconductor layer 1c of the substrate by means of CVD technique. Because the round taper is formed at the top edge of the base electrode forming film 12 exposed from the emitter aperture 14 at that time, the edge can be well covered by the insulation film 21. In other words, the sufficient thickness of the insulation film 21 formed on the edge portion is secured. The reason why the edge portion of the insulation film 20 should be secured sufficiently is that the conduction between the base electrode and the emitter electrode described hereinafter through the edge portion should be prevented. If the edge portion is covered not sufficiently by the insulation film 20, the base electrode is conductive to the emitter electrode through the edge portion. As described hereinabove, the conductive film 21 comprises a silicon film that is a semiconductor film.

Figure 17:
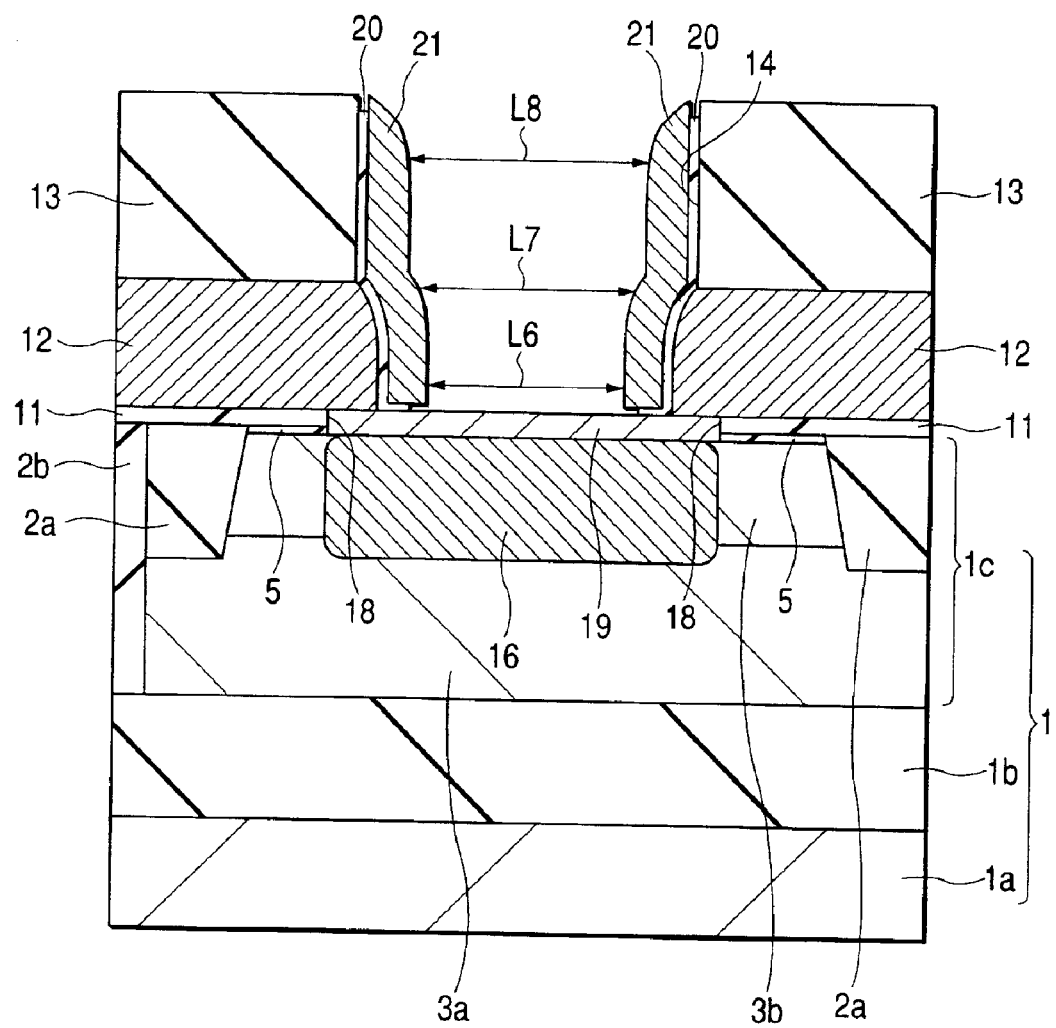
FIG. 17 is a partially enlarged cross sectional view of the semiconductor device during the manufacturing process subsequent to FIG. 16.

Next, FIG. 17 is a partially enlarged cross sectional view of the semiconductor device during the manufacturing process subsequent to FIG. 16.

Herein, at first, the conductive film 21 is etched back by means of dry etching technique. At that time, etching is carried out under the condition of a relatively small power as small as, for example, 60 W in $Cl_2$ gas. The etching gas contains no light element such as hydrogen, and a high power, which is employed for dry etching of an oxide film, is not used. Accordingly, the damage of the under layer substrate caused when the side wall film is formed, that is a problem haunting with the technique for forming a side wall film comprising a silicon nitride film on a side wall of an emitter aperture, is avoided.

After such etching back treatment of the conductive film 21, the substrate is subjected to wet etching treatment with diluted hydrofluoric acid to remove the insulation film 20, and the epitaxial layer 19 is exposed again from the bottom of the emitter aperture 14. Because wet etching treatment is carried out for etching in this case, the epitaxial layer 19 will not be damaged. Furthermore, because the insulation film 20 on the side surface of the emitter aperture 14 is covered with the conductive film 21 at that time, the insulation film 20 will not be damaged and remains unremoved. At this stage, the aperture width L6 is estimated to be approximately 200 nm, the aperture width L7 is estimated to be approximately 225 nm, and the aperture width L8 is estimated to be approximately 250 nm in the emitter aperture 14.

Figure 18:
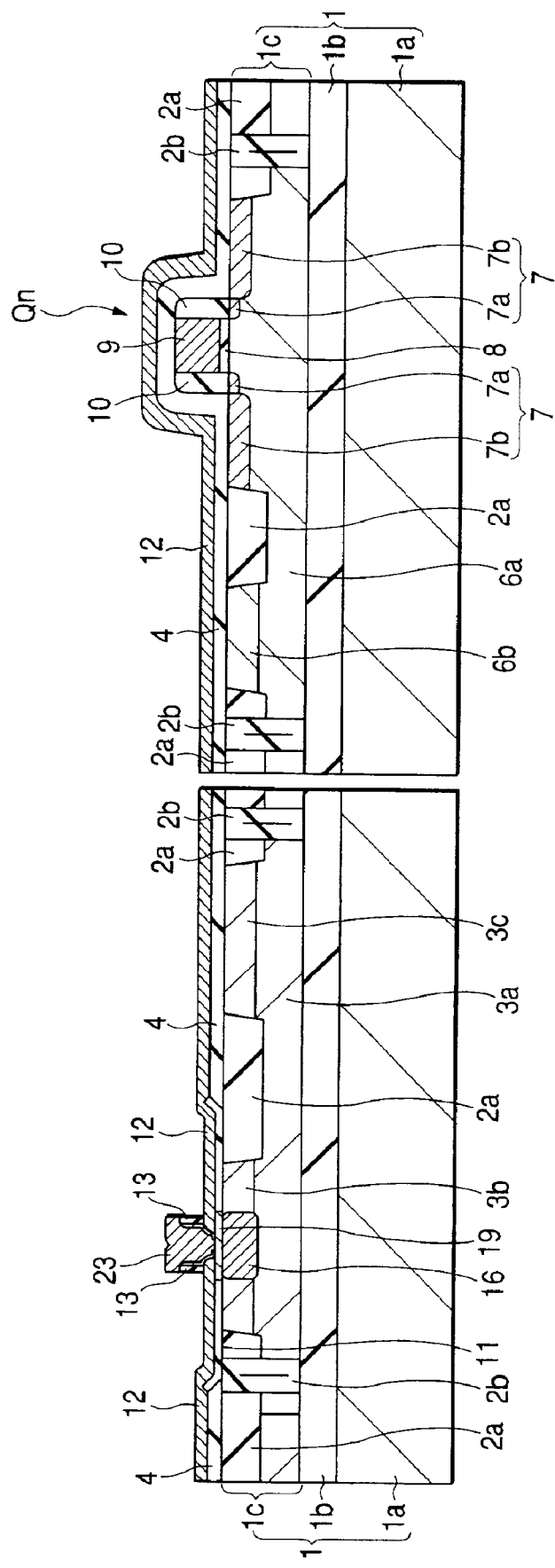
FIG. 18A and FIG. 18B are partially enlarged cross sectional views of the semiconductor device during the manufacturing process subsequent to FIG. 17.
Figure 19:
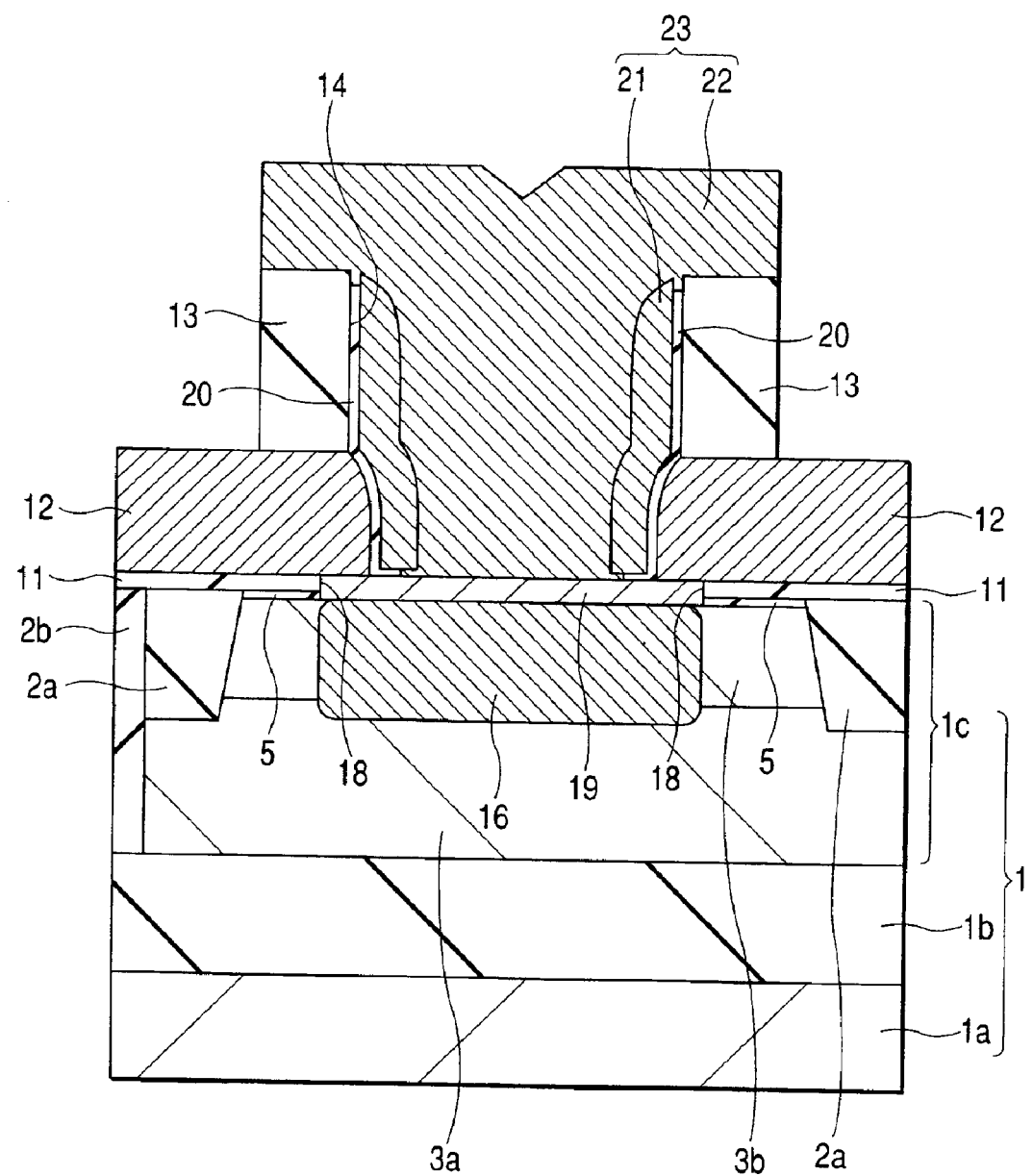
FIG. 19 is a partially enlarged cross sectional view of FIG. 18A.

Next, FIG. 18A and FIG. 18B are partially cross sectional views of the semiconductor device during the manufacturing process subsequent to FIG. 17, and FIG. 19 is a partially enlarged cross sectional view of FIG. 18A.

Herein, at first, a conductive film (second polycrystalline silicon film) 22 comprising a phosphor-doped polycrystalline silicon film having a thickness of, for example, 200 nm is deposited on the both main sides of the substrate 1 by means of CVD technique, and then the conductive film 22 is patterned by means of photolithography technique by use of a resist film and by means of dry etching technique. Thereby, an emitter electrode 23 is formed. The emitter electrode 23 has the conductive films 21 and 22. The conductive film 22 of the emitter electrode 23 is in contact with the epitaxial layer 19 (namely base region) on the bottom of the emitter aperture 14. Subsequently, the insulation film 13 is etched by use of the same resist film to thereby expose the base electrode forming film 12 located under the insulation 13. At this stage, the pattern side surface of the conductive film 22 of the emitter electrode 23 is approximately coincident with the side surface of the insulation film 13 as shown in FIG. 19. As described hereinabove, the conductive film 22 comprises a silicon film that is a semiconductor film.

Figure 20:
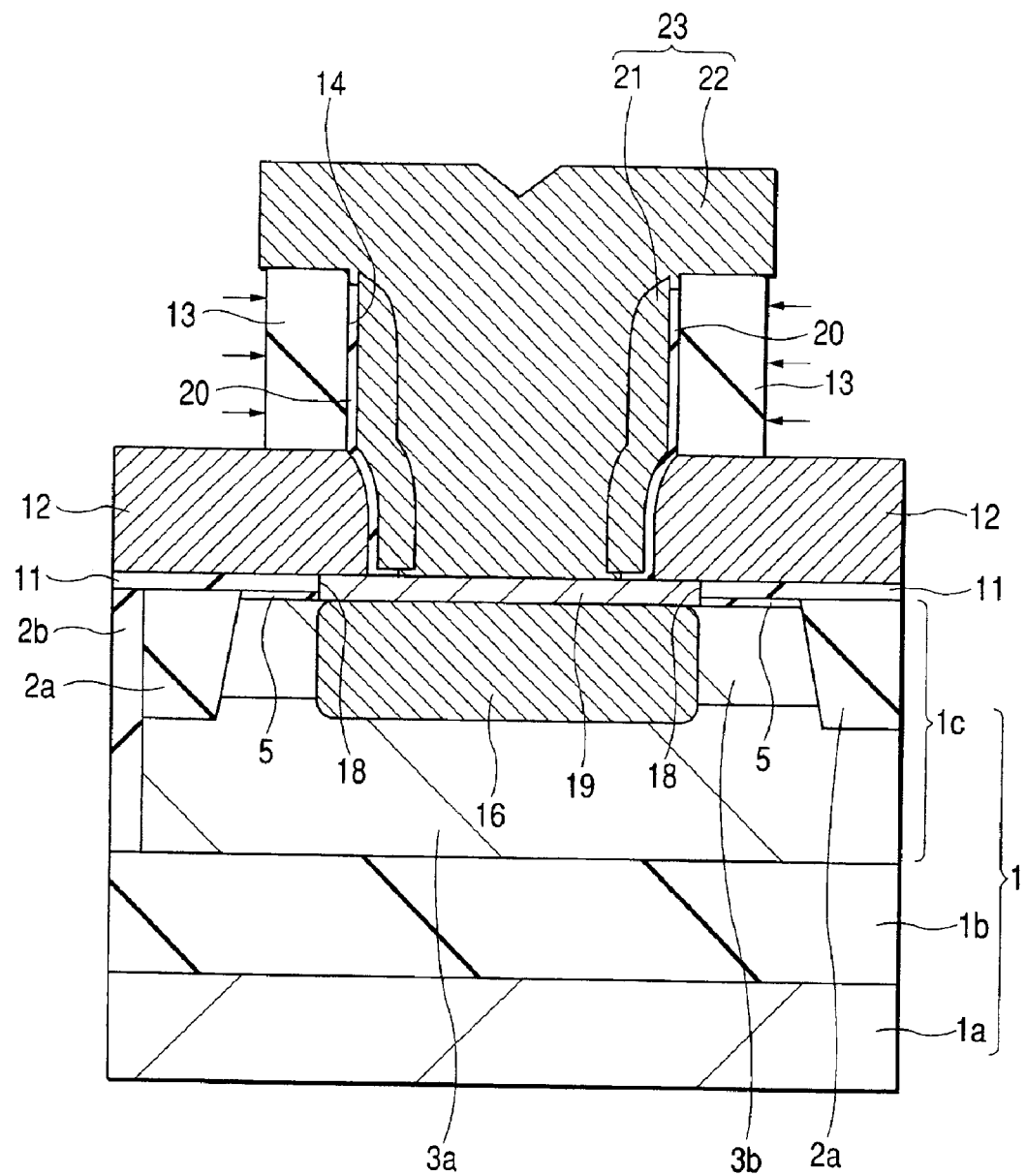
FIG. 20 is a partial cross sectional view of the semiconductor device during the manufacturing process subsequent to FIG. 19.

Next, FIG. 20 is a partially enlarged cross sectional view of the semiconductor device during the manufacturing process subsequent to FIG. 19. Herein, the substrate 1 is subjected to wet etching treatment slightly so that the side surface of the insulation film 13 that remains near the emitter electrode 23 is recessed from the side surface of the emitter electrode 23, that is, so that a under cut is formed on the side surface of the insulation film 13. Thereby, the pattern side surface of the conductive film 22 of the emitter electrode 23 projects slightly from the side surface of the insulation film 13. Arrows shown in FIG. 20 indicate that the side surface of the insulation film 13 is removed by means of etching treatment and recessed.

Figure 21:
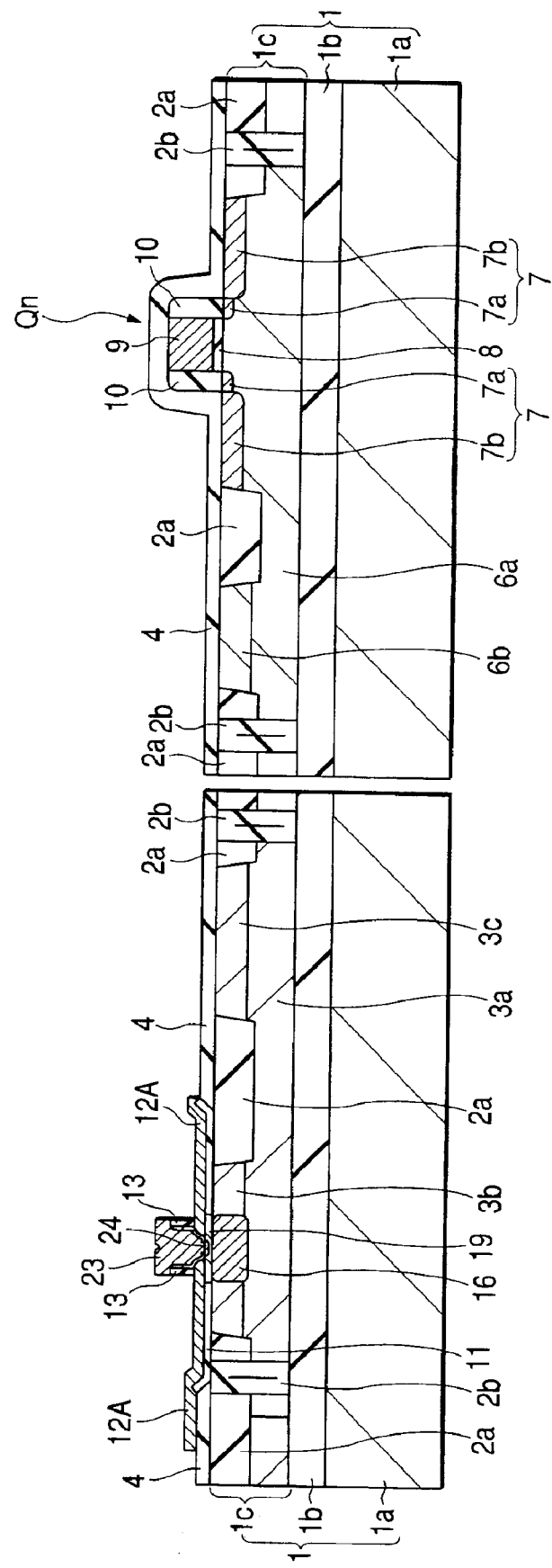
FIG. 21A and FIG. 21B are partial cross sectional views of the semiconductor device during the manufacturing process subsequent to FIG. 20.
Figure 22:
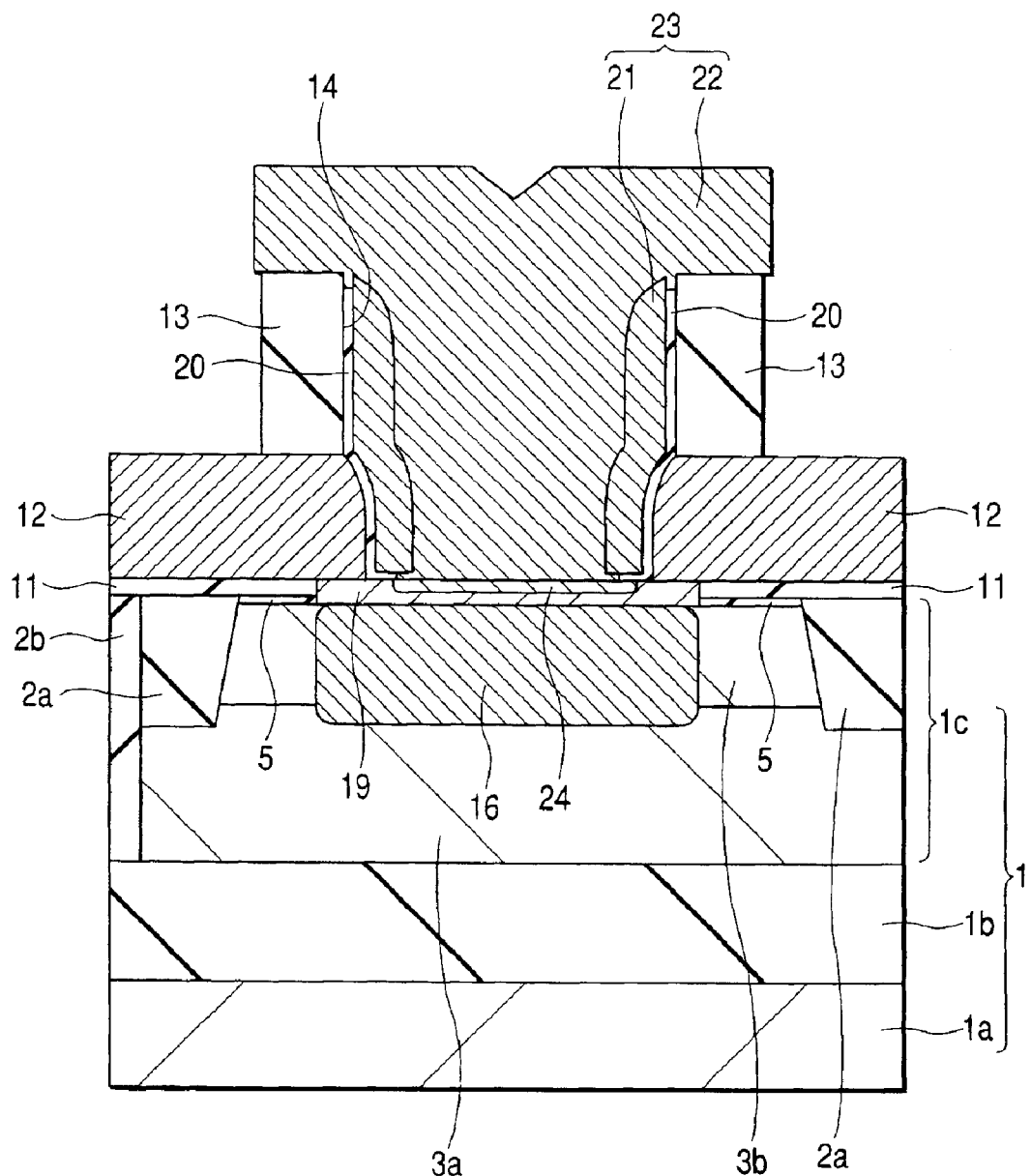
FIG. 22 is a partially enlarged cross sectional view of FIG. 21A.

Next, FIG. 21A and FIG. 21B are partial cross sectional views of the semiconductor device during the manufacturing process subsequent to FIG. 20, and FIG. 22 is a partially enlarged cross sectional view of the FIG. 21A.

Herein, at first, the substrate 1 is subjected to heat treatment, for example, at 900° C. for 30 seconds so that phosphor in the conductive film 22 of the emitter electrode 23 is diffused into the i-Si layer of the epitaxial layer 19 to form an emitter region 24 on the top of the epitaxial layer 19 (the region that is in contact with the conductive film 22). Subsequently, the base electrode forming film 12 is patterned by means of photolithography technique and dry etching technique to form a base electrode 12A.

Because the current is reduced to reduce the power consumption of the bipolar transistor, it is required to narrow the width of the emitter region 24 (emitter width). However, in some cases, the narrow emitter width results in reduced circuit performance because the series resistor, particularly the emitter resistance, becomes higher due to generation of voids in the emitter aperture as described hereinafter. On the other hand, in the present embodiment, the cross sectional configuration of the aperture for forming the emitter electrode 23 is fan-shaped. In other words, the width of the aperture is wider as the position is further from the semiconductor layer 1c. Thereby, the polycrystalline silicon film for forming emitter electrode is embedded successfully in the aperture without generation of voids as described hereinafter. Therefore, it is possible to reduce the emitter series resistance even though the emitter width is narrow. In other words, it is possible to realize a high performance bipolar transistor.

Figure 23:
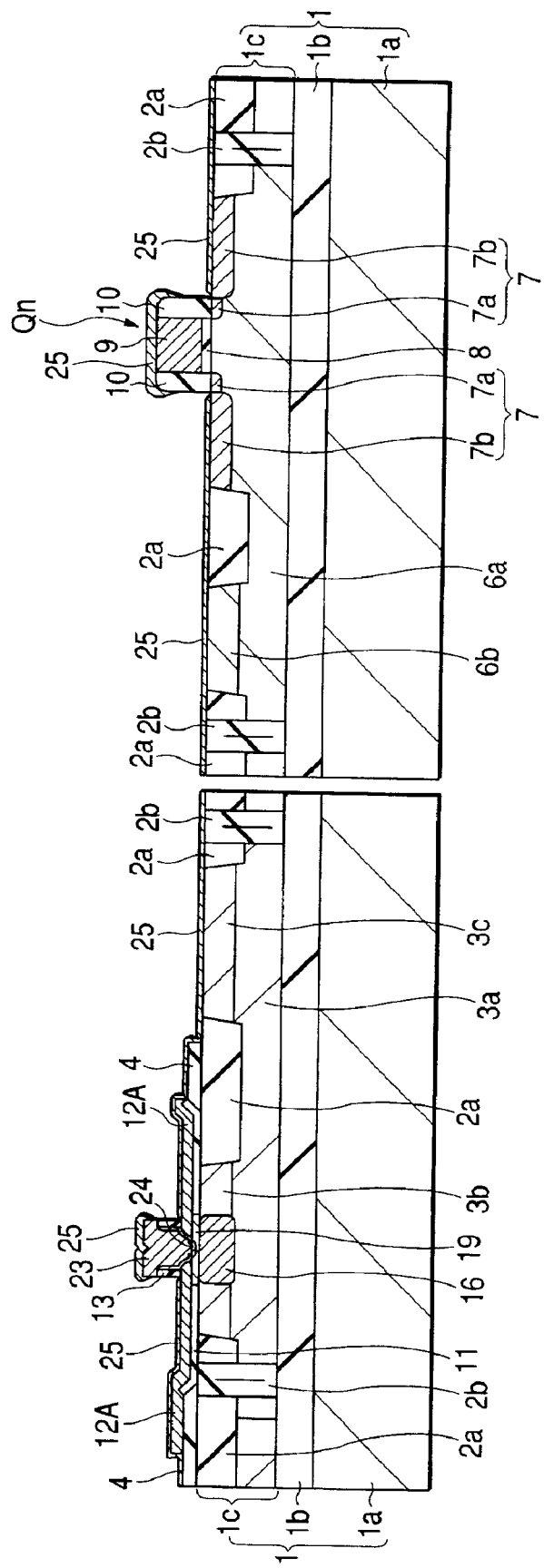
FIG. 23A and FIG. 23B are partial cross sectional views of the semiconductor device during the manufacturing process subsequent to FIG. 21A and FIG. 21B.
Figure 24:
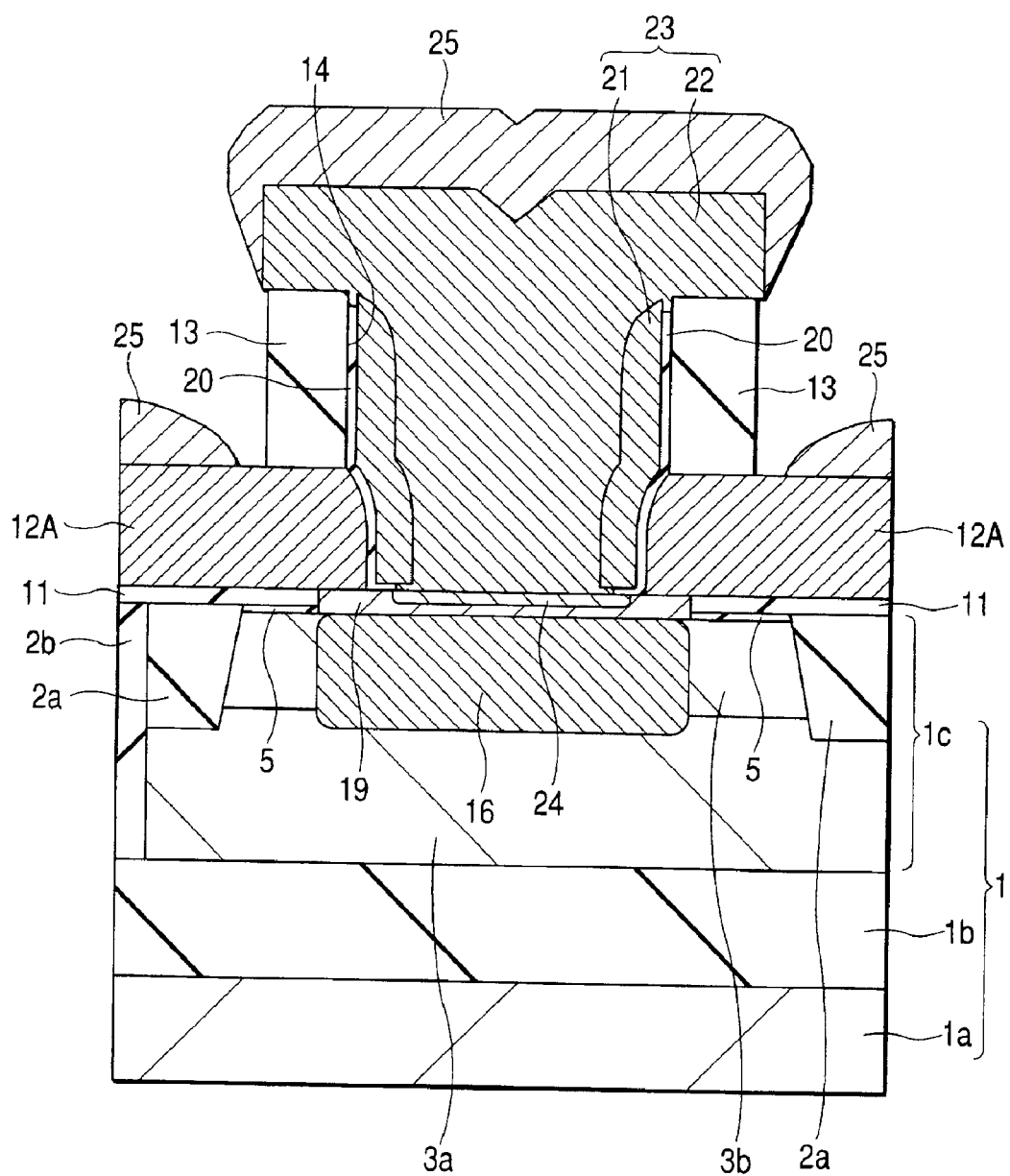
FIG. 24 is a partially enlarged cross sectional view of FIG. 23A.

Next, FIG. 23A and FIG. 23B are partial cross sectional views of the semiconductor device during the manufacturing process subsequent to FIG. 21, and FIG. 24 is a partially enlarged cross sectional view of the FIG. 23A. Herein, the top surfaces of the $N^+$-type collector leading region 3c, p-well leading region 6b, and n-type semiconductor region 7, and the gate electrode 9 are exposed by etching to remove the insulation film 4 partially, and then a conductive film 25 comprising, for example, a titanium (Ti) film or cobalt (Co) film having a thickness of approximately 40 nm is deposited on the main surface of the semiconductor layer 1c of the substrate by means of spattering technique. At that time, because the spattering technique is directive, the conductive film 25 is scarcely deposited on the side surface of the elements on the substrate 1. Particularly, in the present embodiment, the side surface of the insulation film 13 is under cut slightly, the both ends of the emitter electrode 24 function as the pent roof, and as the result the conductive film 25 is not deposited on the side surface of the insulation film 13. Therefore, the emitter electrode 24 will not be connected to the base electrode 12A through the conductive film 25. The technique in which the side surface of the insulation film 13 is recessed and then a metal film is deposited, and a silicide is formed by means of heat treatment can be applied to the method for manufacturing a semiconductor device having another bipolar transistor provided with no epitaxial layer 19.

Figure 25:
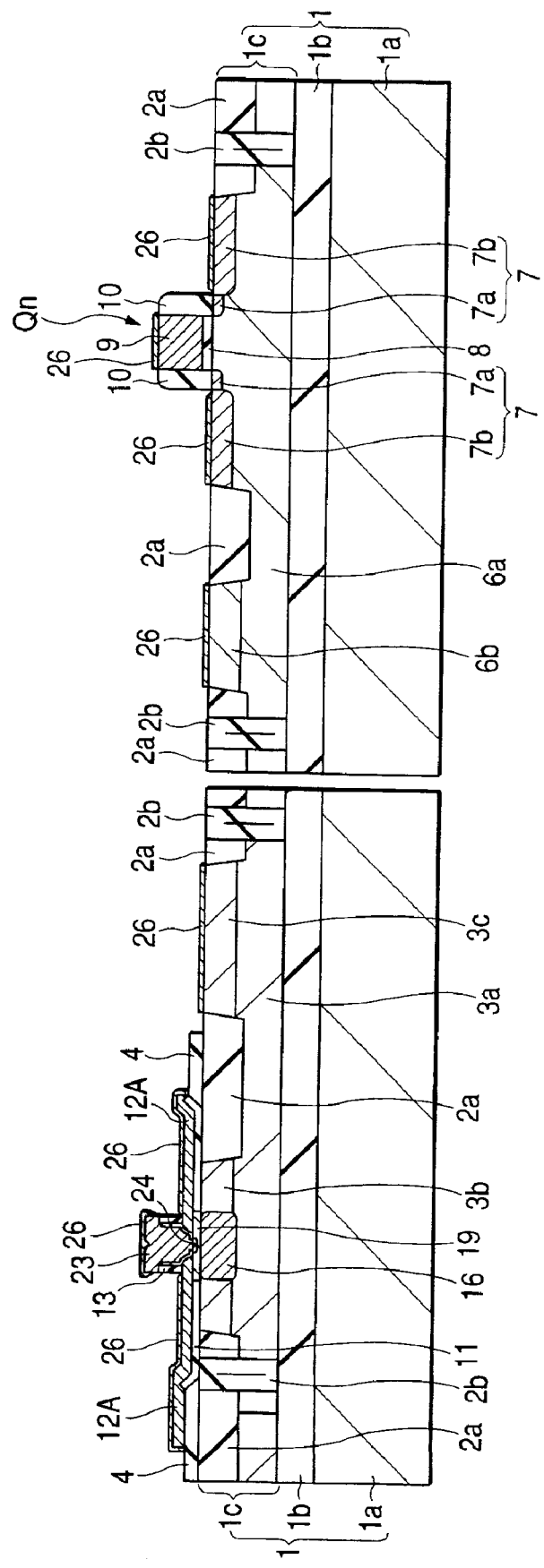
FIG. 25A and FIG. 25B are partial cross sectional views of the semiconductor device during the manufacturing process subsequent to FIG. 23A and FIG. 23B.
Figure 26:
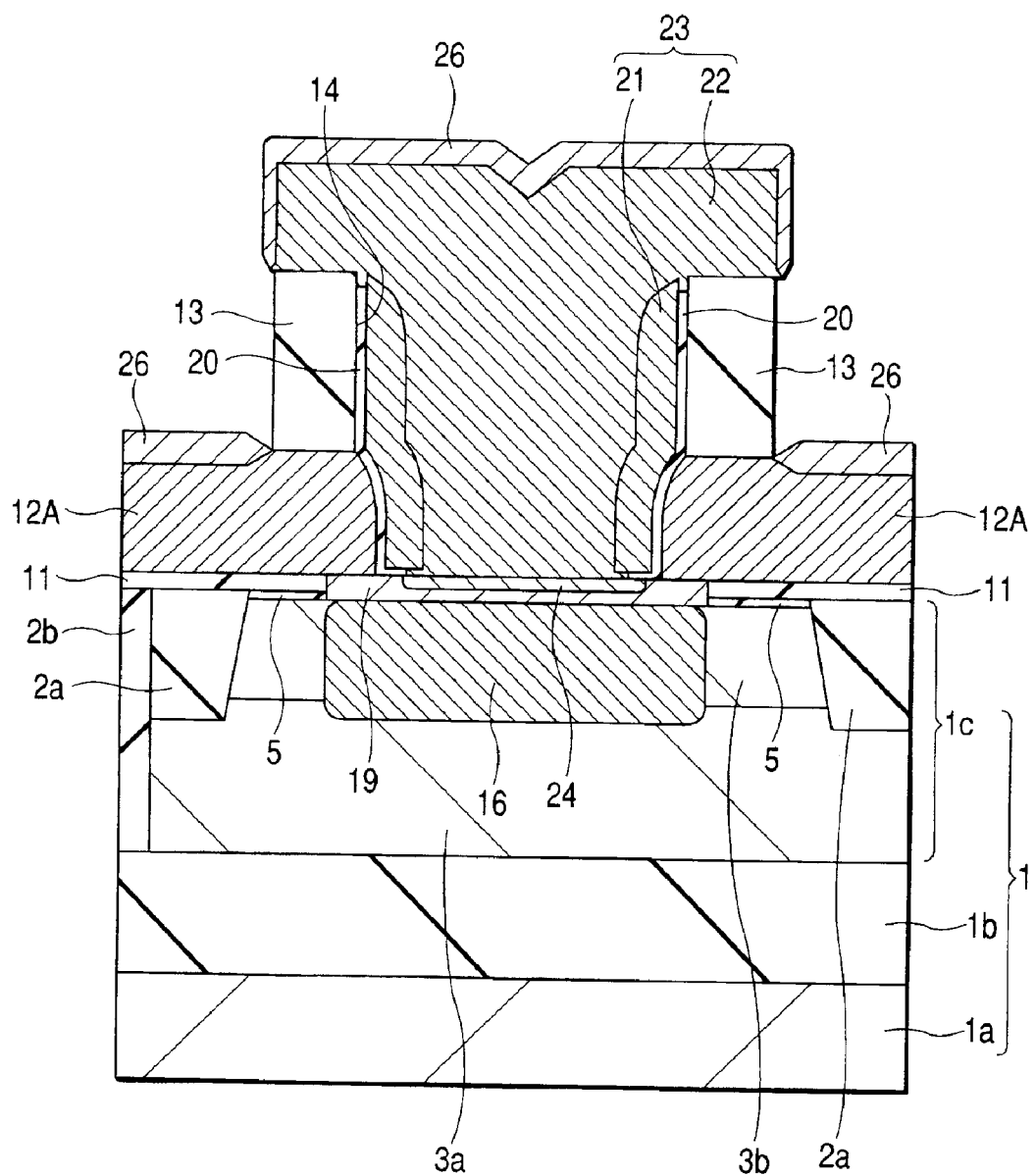
FIG. 26 is a partially enlarged cross sectional view of FIG. 25A.

Next, FIG. 25A and FIG. 25B are partial cross sectional views of the semiconductor device during the manufacturing process subsequent to FIG. 23, and FIG. 26 is a partially enlarged cross sectional view of FIG. 25A.

Herein, the substrate 1 is subjected to heat treatment at a temperature, for example, 680° C. for one minute to form a silicide layer 26 consisting of, for example, titanium silicide ($TiSi_x$) or cobalt silicide ($CoSi_x$) on the top surface of the emitter electrode 23, base electrode 12A, $N^+$-type collector leading region 3c, p-well leading region 6b, n-type semiconductor region 7 and gate electrode 9, and un-reacted portion is removed thereafter. In the case that cobalt silicide is used as the silicide layer 26, the resistance can be reduced regardless of finer pattern in comparison with the case that titanium silicide is used.

Figure 27:
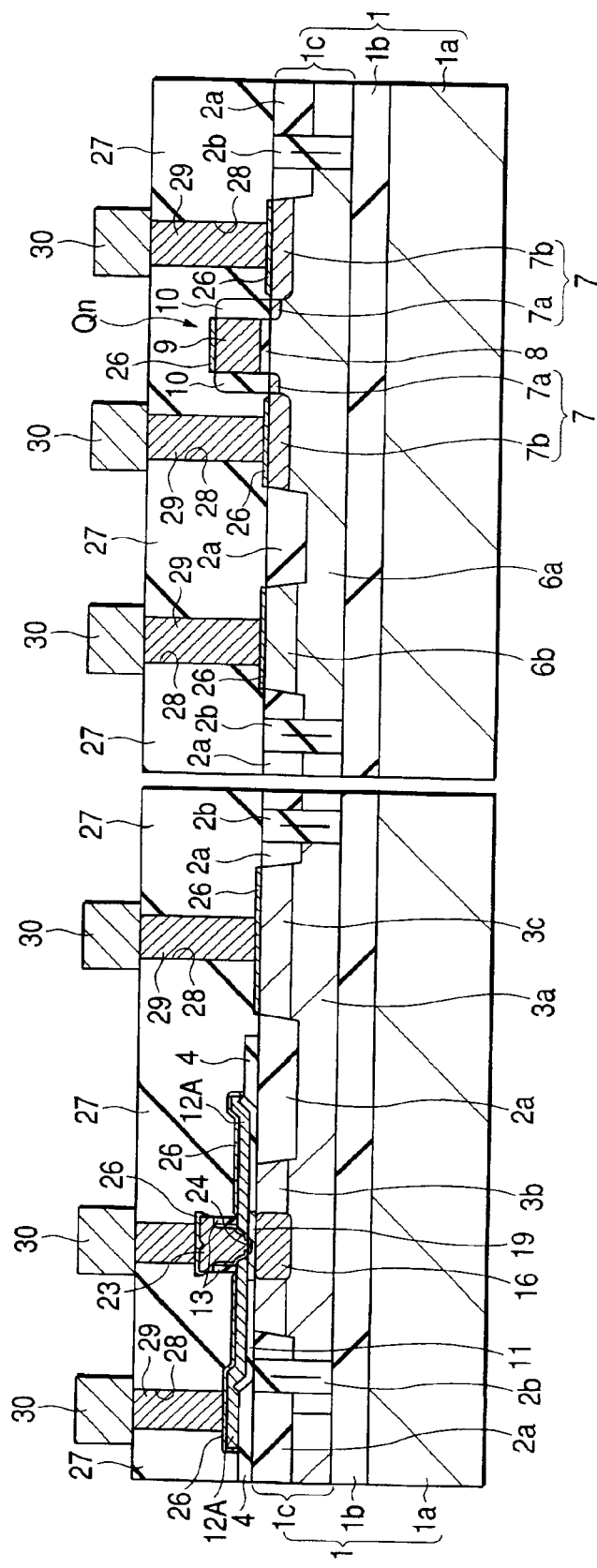
FIG. 27A and FIG. 27B are partial cross sectional views of the semiconductor device during the manufacturing process subsequent to FIG. 25A and FIG. 25B.

Next, FIG. 27A and FIG. 27B are partial cross sectional views of the semiconductor device during the manufacturing process subsequent to FIG. 25.

Herein, an insulation film comprising, for example, a silicon oxide film is deposited on the main surface of the semiconductor layer of the substrate 1 by means of CVD technique or coating technique, or by means of both techniques, the top surface of the insulation film is polished by means of CMP (Chemical Mechanical Polish) technique to flatten it, and thus an interlayer insulation film 27 is formed. Subsequently, a contact hole 28 is formed on the interlayer insulation film 27. Subsequently, a relatively thin conductive film comprising a laminate layer having, for example, a titanium film and titanium nitride film is deposited on the interlayer insulation film 27, and a relatively thick conductive film comprising, for example, a tungsten film is deposited thereon, and it is polished by means of CMP (Chemical Mechanical Polish) technique to form a plug 29 in the contact hole 28. Thereafter, a conductive film that mainly contains, for example, aluminum or aluminum alloy is deposited on the plug 29 and interlayer insulation film 27 by means of spattering technique, and it is patterned by means of photolithography technique and dry etching technique to form a first layer wiring 30. After this process, a semiconductor device having a bipolar transistor and MIS is manufactured through the usual processes applied for manufacturing a semiconductor device.

Figure 28:
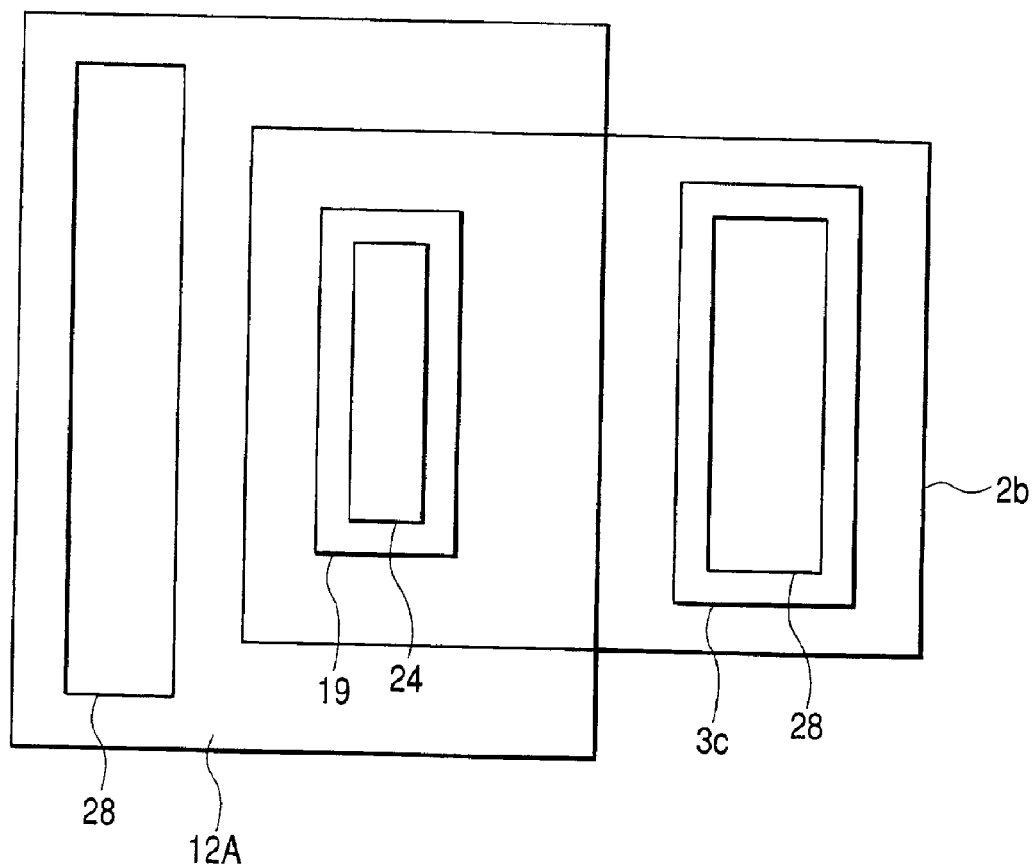
FIG. 28 is a plan view of an NPN-type bipolar transistor.

FIG. 28 is a plan view of a NPN-type bipolar transistor. The area of the emitter region 24 is, for example, approximately $0.2 \times 1$ $\mu m^2$. The emitter region 24, $n^+$-type collector leading region 3c, and contact hole 28 that extends to the base electrode 12A are formed in the shape of plane rectangle, and disposed so that longer sides of these rectangles are arranged in parallel.

Figure 29:
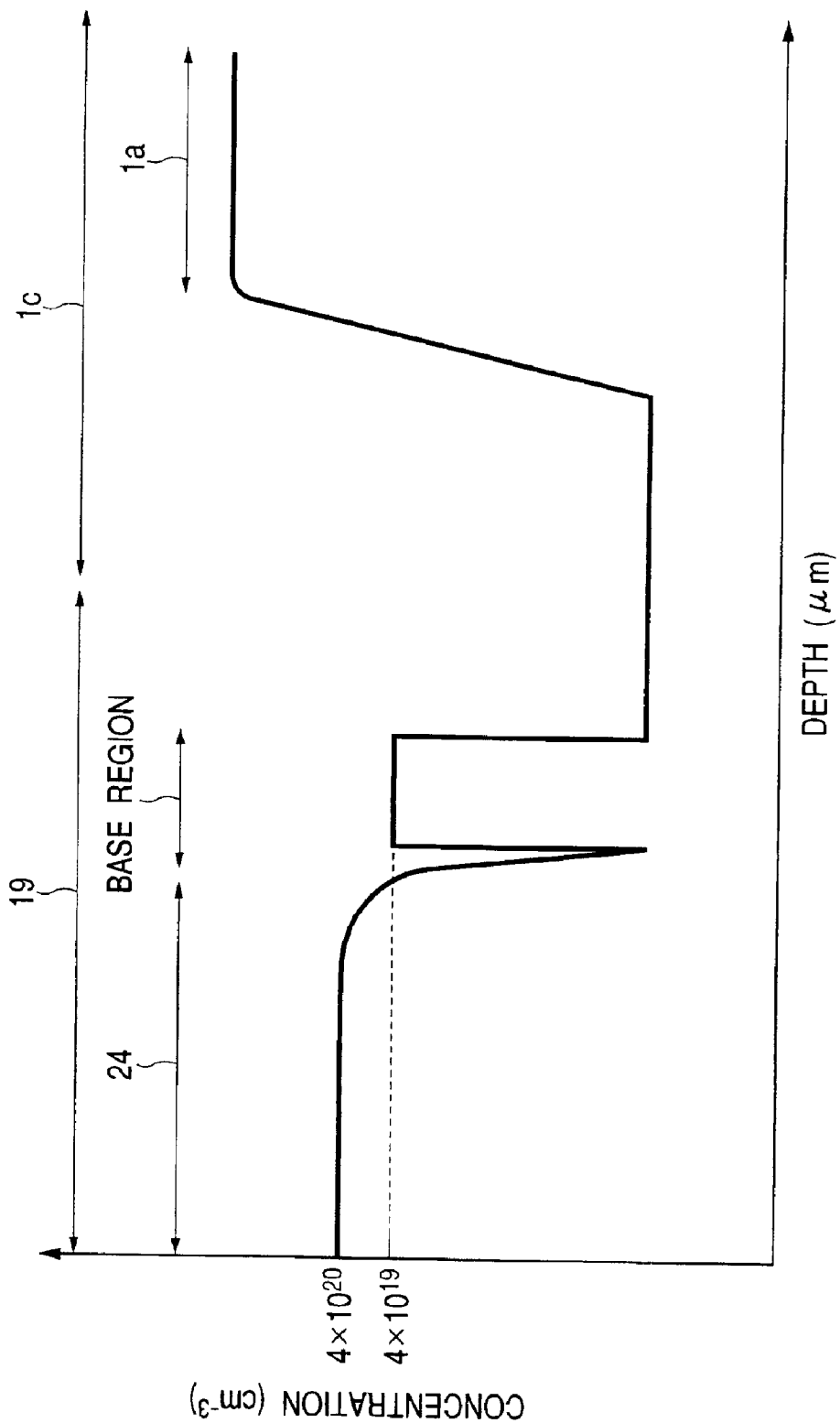
FIG. 29 is a graph for showing the impurity concentration distribution of the NPN-type bipolar transistor of the embodiment.
Figure 30:
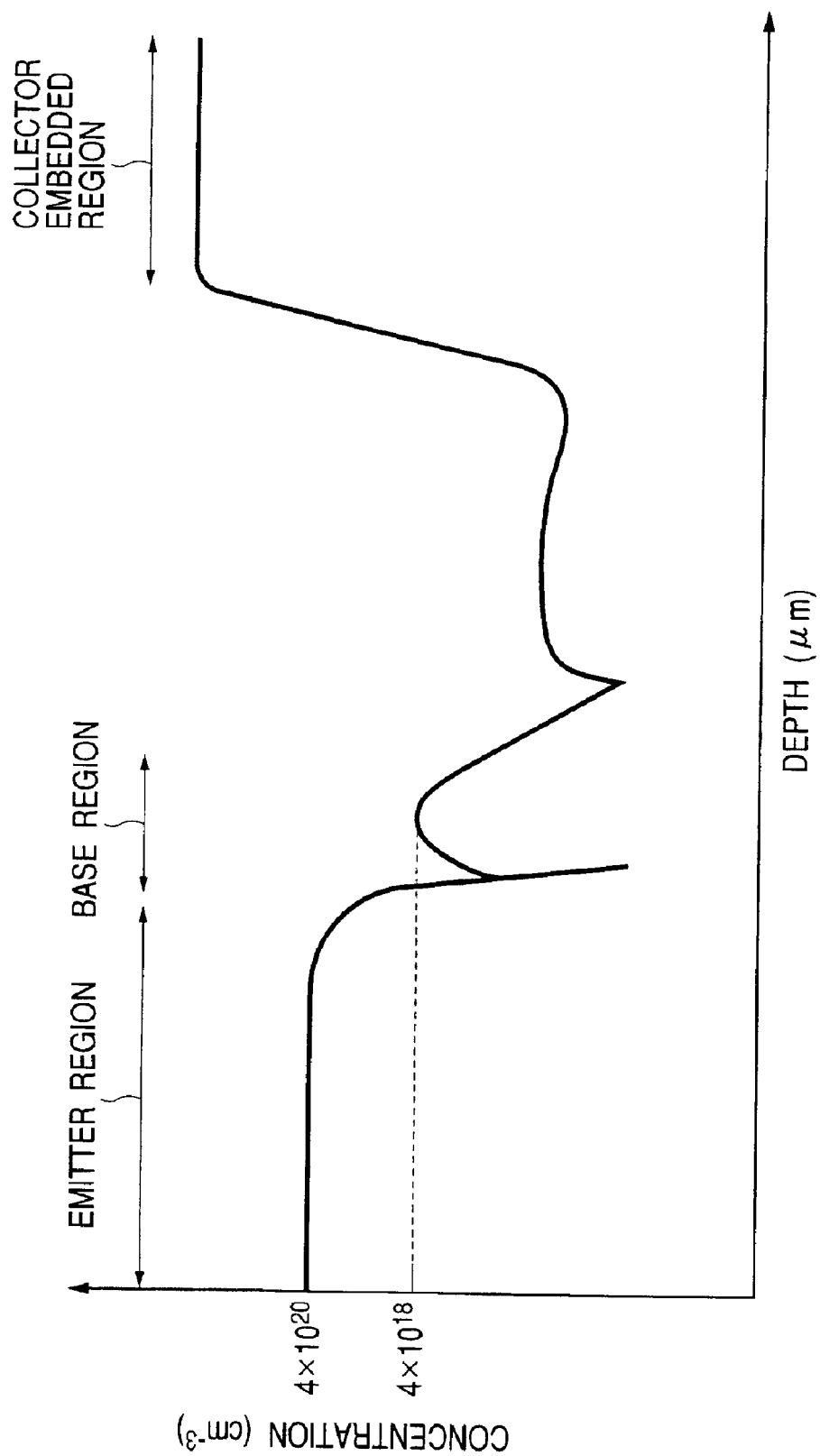
FIG. 30 is a graph for showing the impurity concentration distribution of a conventional bipolar transistor having a base region formed by means of ion injection technique.

FIG. 29 shows the impurity distribution of the NPN-type bipolar transistor. Furthermore, FIG. 30 shows the impurity distribution of a conventional bipolar transistor having the base region formed by means of ion injection technique for comparison with the above-mentioned NPN-type bipolar transistor.

Because a base region having impurity profile that is more similar to box type (rectangular) in the case that the base region is formed by means of epitaxial growing technique than in the case that the base region i is formed by means of ion injection technique can be formed, it is possible to optimize the withstand voltage (BVceo) between a collector and emitter and the shutdown frequency (fTMAX) though the withstand voltage and the shutdown frequency are in tradeoff relation to each other and it is difficult to set both in good condition. Furthermore, a narrow base type hetero junction bipolar transistor is realized by changing the base region to SiGe mixed crystal, and it is possible to improve the performance such as high speed shutdown frequency and high early voltage. Furthermore, because the contact region (graft base portion) between the base electrode 12A and the semiconductor layer 1c is formed in self-alignment fashion by forming the base region by means of selective epitaxial growing technique, the graft base width can be reduced regardless of the restriction of lithography technique, and it is possible to reduce a parasitic capacitance (Ctc) between the base resistor (rbb') and the collector base.

Furthermore, according to the result obtained by the inventors of the present invention, it has been found that the emitter resistance of a bipolar transistor manufactured according to the process of the present embodiment is lower than that manufactured according to the technique developed by the inventors of the present invention.

Figure 31:
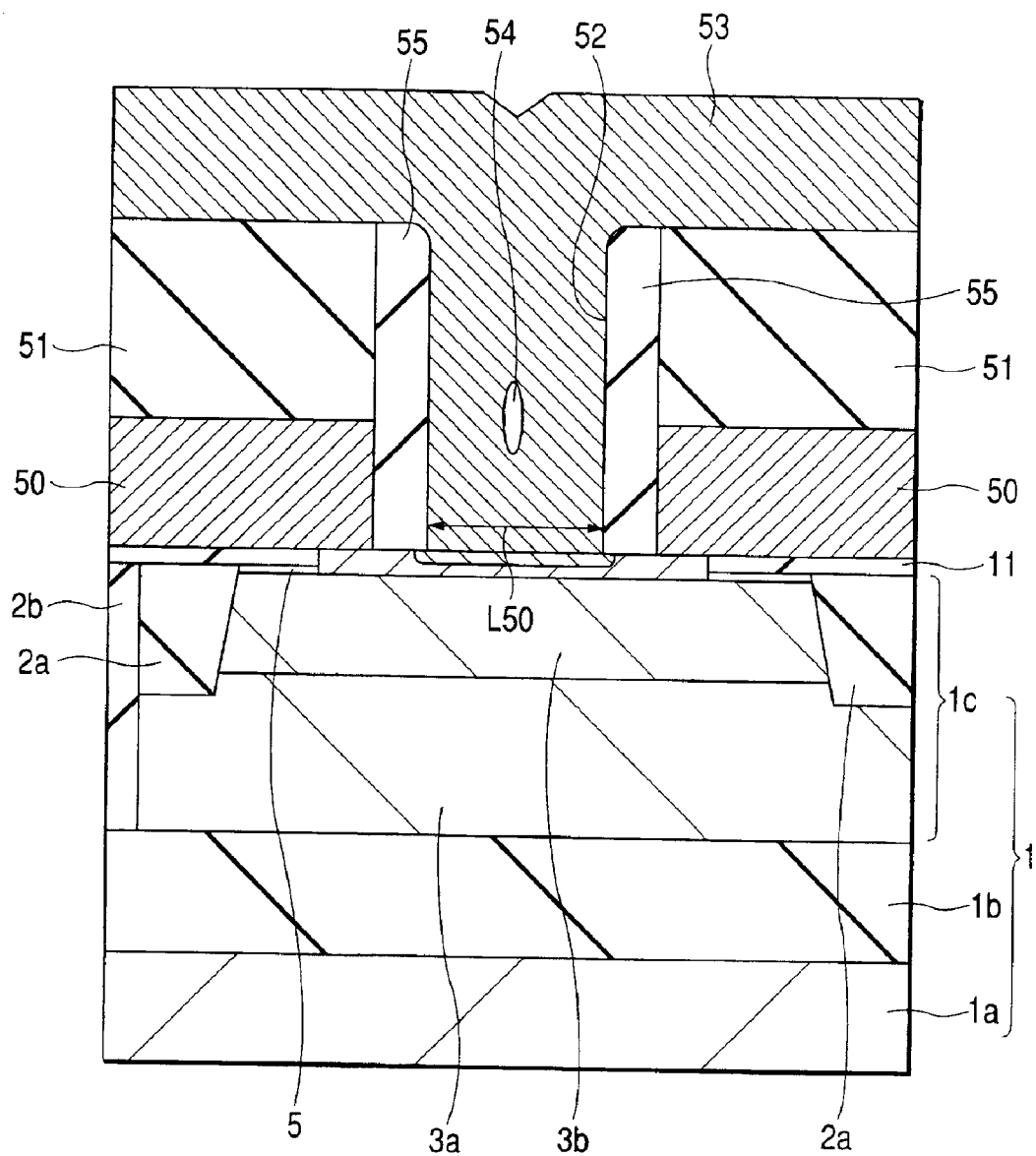
FIG. 31 is a partial cross sectional view of a bipolar transistor fabricated by means of technique developed by the inventors of the present invention.

FIG. 31 is a partial cross sectional view of a bipolar transistor manufactured according to the technique developed by the present inventors of the present invention for comparison. In the case that the base electrode 50 has a thickness of 200 nm, the insulation film 51 located on the base electrode 50 has a thickness of 200 nm, and the aperture width L50 of the emitter aperture 52 is 200 nm in the technique developed by the inventors of the present invention, the aspect ratio of the emitter aperture 52 is 2. Because the coverage of the emitter electrode forming phosphor-doped polycrystalline silicon film 53 that is embedded in the emitter aperture 52 is only 0.7, a void 54 is formed in the phosphor-doped polycrystalline silicon film 53. According to the evaluation image of a cross section of a specimen prepared actually by the inventors of the present invention that was taken by use of a SEM (scanning type electron microscope), it has been found that a void having a width of approximately 50 nm is formed in the phosphor-doped polycrystalline silicon film in the emitter aperture. Furthermore, in some cases, such void is generated in the case that the aspect ratio of the emitter aperture is 1 or larger. In this case, the side wall 55 of the emitter aperture 52 comprises a silicon nitride film.

On the other hand, in the case of that manufactured according to the present embodiment, it is estimated that the aperture width L6 is 200 nm, the aperture width L7 is 225 nm, and the aperture width L8 is 250 nm as shown in FIG. 17. Herein, series resistivity of both bipolar transistors is compared wherein the phosphor-doped polycrystalline resistance is denoted by ps. In the case of the above-mentioned developed technique, the series resistance R1 is represented as $R1 = \rho s \times (300/200 + 300/100) \times L$. In the present embodiment, the series resistance R2 is represented as $R2 = \rho s \times (200/250 + 100/225 + 100/200) \times L$. Therefore, R2/R1 = 38% is obtained, and the series resistance of the phosphor-doped polycrystalline silicon portion is reduced by 62% in comparison with the developed technique. The actual emitter resistance includes the boundary resistance caused from the boundary between the emitter electrode and the Si substrate, the contact resistance caused from the contact between the phosphor-doped polycrystalline silicon and the silicide layer, and these factors should be taken into consideration, but 24 Ω is likely attributed to the parasitic resistance component in the phosphor-doped polycrystalline silicon film based on the resistivity of the phosphor-doped polycrystalline silicon film out of the measured 40 Ω of the emitter resistance Re of the bipolar transistor having an emitter area of 0.2 $\mu m \times 1.0$ $\mu m$. Based on the above, the above-mentioned improvement is likely effective to reduce the parasitic resistance component.

The present invention accomplished by the inventors of the present invention is described hereinbefore in detail based on the embodiment, the present invention is by no means limited to the embodiment, and as a matter of course various modifications may be employed without departing from the spirit and scope of the invention.

For example, a case in which the usual wiring structure is employed for wiring is described in the embodiment, but the wiring is by no means limited to this case, and, for example, the wiring structure of so-called damascene or dual damascene technique in which a conductive film is embedded in a groove formed on an insulation film to form a wiring or plug may be employed.

Furthermore, a case in which SOI (Silicon On Insulator) substrate is used as the substrate is described in the abovementioned embodiment, but the substrate is by no means limited to this case, and, for example, a usual semiconductor substrate (wafer) obtained by cutting a semiconductor ingot manufactured by means of crystal growing technique may be employed. Furthermore, so-called epitaxial wafer having an epitaxial layer on the surface of a usual semiconductor substrate may be employed.

A case in which the invention accomplished by the inventors of the present invention is applied to the method for manufacturing a semiconductor device on which the NPN type bipolar transistor and MIS are formed on a single substrate, which is the field of application that is the background of the invention, is described mainly, but the application of the present invention is by no means limited to this case, and can be applied in various fields. For example, the present invention may be applied to the method for manufacturing a semiconductor device having a bipolar transistor but having no MIS, a semiconductor device having NPN type and PNP type bipolar transistors, a semiconductor device having a memory circuit such as DRAM (Dynamic Random Access Memory), SRAM (Static Random Access Memory), or flush memory (EEPROM; Electric Erasable Programmable Read Only Memory), a semiconductor device having a logic circuit such as microprocessor, or a consolidated semiconductor device having the abovementioned memory circuit and logic circuit on a single semiconductor substrate.

The effect to be obtained by a typical invention out of the inventions disclosed in the present specification is described herein under.

In detail, by forming an insulation film that functions as a protection film when a base region forming epitaxial layer is grown selectively, damage caused on the epitaxial growing surface is mitigated and the crystallinity of the epitaxial layer grown thereon is improved. Thereby, it is possible to improve the performance of a bipolar transistor.

What is claimed is:

1. A method for manufacturing a semiconductor device comprising the steps of:
   (a) depositing a silicon nitride film on a semiconductor substrate;
   (b) depositing a base electrode forming silicon film of a bipolar transistor on the silicon nitride film;
   (c) depositing a first silicon oxide film on the base electrode forming silicon film;
   (d) forming an aperture that reaches the silicon nitride film on the first silicon oxide film and the base electrode forming silicon film;
   (e) forming a second silicon oxide film on the side surface of the base electrode forming silicon film that is exposed from the aperture by applying a first oxidation treatment on the semiconductor substrate;
   (f) etching and removing the silicon nitride film in isotropic fashion so that a side surface of the silicon nitride film is recessed from a side surface of the base electrode forming silicon film in the aperture by applying wet etching treatment on the silicon nitride film; and
   (g) forming a base region forming epitaxial layer selectively on the semiconductor substrate that is exposed from the aperture,
   wherein said aperture is filled without performing a second oxidation treatment on the substrate.

2. The method for manufacturing a semiconductor device according to claim 1, after the step (d) and before the step (e), comprising the steps of: applying wet etching on the semiconductor substrate; and removing a part of the first silicon oxide film so that a side surface of the first silicon oxide film in the aperture is recessed from a side surface of the base electrode forming silicon film in the aperture and an aperture size of the first silicon oxide film in the aperture is made larger than an aperture size of the base electrode forming silicon film.

3. The method for manufacturing a semiconductor device according to claim 1, comprising a step of making the thickness of the second silicon oxide film formed on a region where the first impurity is introduced thicker than that of the silicon oxide film formed on the region other than the first impurity introduced region in the base electrode forming silicon film that is exposed from the aperture during the step (e), by applying a step of introducing the first impurity into a portion of the base electrode forming silicon film on the side with which the first silicon oxide film is in contact after the step (b) and before the step (c).

4. The method for manufacturing a semiconductor device according to claim 1, comprising the step of:
   (h) removing the entire second silicon oxide film or the exposed portion of the first silicon oxide film so that the aperture size of the first silicon oxide film is made larger than the aperture size of the base electrode forming silicon film in the aperture after the step (g).

5. The method for manufacturing a semiconductor device according to claim 4, comprising the steps of: after the step (h),
   (i) depositing a third silicon oxide film on the semiconductor substrate including the internal of the aperture;
   (j) depositing an emitter electrode forming first silicon film on the third silicon oxide film and thereafter etching back the first silicon film;
   (k) etching and removing the third silicon oxide film to expose the epitaxial layer from the aperture by use of the emitter electrode forming first silicon film that has been not removed in the etching back process as a mask;
   (l) depositing an emitter electrode forming second silicon film on the semiconductor substrate including the internal of the aperture; and
   (m) patterning the emitter electrode forming second silicon film to form an emitter electrode.

6. The method for manufacturing a semiconductor device according to claim 5, comprising the steps of: introducing the second impurity in the second silicon film in the step (e); and diffusing the second impurity in the emitter electrode forming second silicon film into the epitaxial layer to form an emitter region on the epitaxial layer after the step (m).

7. The method for manufacturing a semiconductor device according to claim 6, comprising the steps of:
   removing the first silicon oxide film located near the emitter electrode so that the side surface of the first silicon oxide film is recessed from the side surface of the emitter electrode; and
   depositing a metal film on the semiconductor substrate including the emitter electrode and then applying heat treatment on the semiconductor substrate to thereby form a silicide layer on the portion where the metal film is in contact on the emitter electrode and semiconductor substrate.

8. The method for manufacturing a semiconductor device according to claim 7, wherein the metal film is deposited by means of spattering technique.

9. The method for manufacturing a semiconductor device according to claim 1, comprising the steps of: before the step (a),
   forming a gate insulation film on the semiconductor substrate;
   forming a gate electrode on the gate insulation film; and
   forming a semiconductor region for source and drain on the semiconductor substrate to thereby form a field-effect transistor on the semiconductor substrate.

10. The method for manufacturing a semiconductor device according to claim 1, wherein the epitaxial layer is mainly comprised of silicon-germanium, silicon-germanium-carbon, or silicon.

11. A method for manufacturing a semiconductor device according to claim 1, wherein the second silicon oxide film serves as a protection film during epitaxial growing of the base region forming epitaxial layer.

12. A method for manufacturing a semiconductor device according to claim 1, further comprising the step of:
   (h) between the step (b) and the step (c), introducing a first impurity of a surface portion of the base electrode forming silicon film, wherein, in the step (e), the second silicon oxide film is formed such that a thickness of the second silicon oxide film at a side surface of the base electrode forming silicon film is less than a thickness of the second silicon oxide film at an upper surface portion of the base electrode forming silicon film.

13. A method for manufacturing a semiconductor device comprising a step of applying a first oxidation treatment to form an insulation film that functions as a protection film during epitaxial growing on the emitter aperture prior to selective growing of a base region forming epitaxial layer on a semiconductor substrate that is exposed from a bottom of the emitter aperture,
   wherein said aperture is filled without performing a second oxidation treatment on the substrate.

14. A method for manufacturing a semiconductor device comprising the steps of:
   (a) forming an oxidation resistance film over a semiconductor substrate;
   (b) forming a base electrode forming silicon film of a bipolar transistor over the oxidation resistance film;
   (c) introducing a first impurity of a surface portion of the base electrode forming silicon film;
   (d) after the step (c), forming a first silicon oxide film over the base electrode forming silicon film;
   (e) forming an opening in the first silicon oxide film and in the base electrode forming silicon film such that the opening reaches the oxidation resistance film;
   (f) after the step (e), performing a first oxidation treatment to form a second silicon oxide film such that a thickness of the second silicon oxide film at a side surface of the base electrode forming silicon film is less than a thickness of the second silicon oxide film at an upper surface portion of the base electrode forming silicon film;
   (g) removing the oxidation resistance film at the opening; and
   (h) after the step (g), forming a base region forming epitaxial layer selectively on the semiconductor substrate at the opening,
   wherein said opening is filled without performing a second oxidation treatment on the substrate.

15. A method for manufacturing a semiconductor device according to claim 14, wherein the second silicon oxide film serves as a protection film during epitaxial growing of the base region forming epitaxial layer.

16. A method for manufacturing a semiconductor device comprising the steps of:
   (a) forming an oxidation resistance film over a semiconductor substrate;
   (b) forming a base electrode forming silicon film of a bipolar transistor over the oxidation resistance film;
   (c) forming a first silicon oxide film over the base electrode forming silicon film;
   (d) forming an opening in the first silicon oxide film and in the base electrode forming silicon film such that the opening reaches the oxidation resistance film;
   (e) forming a second silicon oxide film on the side surface of the base electrode forming silicon film that is exposed from the opening by performing a first oxidation treatment;
   (f) removing the oxidation resistance film at the opening; and
   (g) after the step (f), forming a base region forming epitaxial layer selectively on the semiconductor substrate at the opening,
   wherein said opening is filled without performing a second oxidation treatment on the substrate.

17. A method for manufacturing a semiconductor device according to claim 16, wherein the second silicon oxide film serves as a protection film during epitaxial growing of the base region forming epitaxial layer.

18. A method for manufacturing a semiconductor device according to claim 16, further comprising the step of:
   (h) between the step (b) and the step (c), introducing a first impurity of a surface portion of the base electrode forming silicon film,
   wherein, in the step (e), the second silicon oxide film is formed such that a thickness of the second silicon oxide film at a side surface of the base electrode forming silicon film is less than a thickness of the second silicon oxide film at an upper surface portion of the base electrode forming silicon film.

19. A method for manufacturing a semiconductor device according to claim 16, wherein, in the step (f), the oxidation resistance film is removed such that the oxidation resistance film is recessed from a side surface of the base electrode forming silicon film in the opening by applying wet etching treatment on the silicon nitride film,
   and wherein the oxidation resistance film is a silicon nitride film.

20. A method for manufacturing a semiconductor device comprising the steps of:
   (a) forming a base electrode forming silicon film of a bipolar transistor over a semiconductor substrate;
   (b) forming a first silicon oxide film over the base electrode forming silicon film;
   (c) forming an opening in the first silicon oxide film and in the base electrode forming silicon film; and
   (d) forming a second silicon oxide film on the side surface of the base electrode forming silicon film that is exposed from the opening by performing a first oxidation treatment,
   wherein said opening is filled without performing a second oxidation treatment on the substrate.

21. A method for manufacturing a semiconductor device according to claim 20, wherein the second silicon oxide film serves as a protection film during epitaxial growing of a base region forming epitaxial layer.

22. A method for manufacturing a semiconductor device according to claim 20, further comprising the step of: (e) between the step (a) and the step (b), introducing a first impurity of a surface portion of the base electrode forming silicon film;

wherein, in the step (d), the second silicon oxide film is formed such that a thickness of the second silicon oxide film at a side surface of the base electrode forming silicon film is less than a thickness of the second silicon oxide film at an upper surface portion of the base electrode forming silicon film.

23. A method for manufacturing a semiconductor device according to claim 20, wherein after the step (d), an oxidation resistance film formed under the base electrode forming silicon film is removed such that the oxidation resistance film is recessed from a side surface of the base electrode forming silicon film in the opening by applying wet etching treatment on the silicon nitride film, and wherein the oxidation resistance film is a silicon nitride film.

24. A method fox manufacturing a semiconductor device according to claim 20, further comprising the steps of:

(e) after the step (d), removing, at the opening, an oxidation resistance film formed under the base electrode forming silicon film; and (f) after the step (e), forming a base region forming epitaxial layer selectively on the semiconductor substrate at the opening.

* * * * *